United States Patent
Matsuyama et al.

(10) Patent No.: US 11,505,744 B2
(45) Date of Patent: Nov. 22, 2022

(54) LIQUID CRYSTALLINE COMPOSITION, POLYMER LIQUID CRYSTAL COMPOUND, LIGHT ABSORPTION ANISOTROPIC FILM, LAMINATE, AND IMAGE DISPLAY DEVICE

(71) Applicant: FUJIFILM Corporation, Tokyo (JP)

(72) Inventors: Hiroshi Matsuyama, Kanagawa (JP); Wataru Hoshino, Kanagawa (JP); Teruki Niori, Kanagawa (JP); Naoya Nishimura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 6 days.

(21) Appl. No.: 16/451,417

(22) Filed: Jun. 25, 2019

(65) Prior Publication Data

US 2019/0322937 A1 Oct. 24, 2019

Related U.S. Application Data

(63) Continuation of application No. PCT/JP2017/046955, filed on Dec. 27, 2017.

(30) Foreign Application Priority Data

Dec. 28, 2016 (JP) .............................. JP2016-255956
Jul. 27, 2017 (JP) .............................. JP2017-145568

(51) Int. Cl.
| | | |
|---|---|---|
| C09K 19/38 | (2006.01) | |
| C09K 19/56 | (2006.01) | |
| C09K 19/60 | (2006.01) | |
| G02B 5/30 | (2006.01) | |
| G02F 1/1335 | (2006.01) | |

(52) U.S. Cl.
CPC .......... *C09K 19/3852* (2013.01); *C09K 19/56* (2013.01); *C09K 19/601* (2013.01); *G02B 5/3016* (2013.01); *G02F 1/133528* (2013.01)

(58) Field of Classification Search
CPC .. C09K 19/3852; C09K 19/60; C09K 19/601; C09K 19/603; C09K 19/605; C09K 19/606

See application file for complete search history.

(56) References Cited

U.S. PATENT DOCUMENTS

| | | | | |
|---|---|---|---|---|
| 5,614,125 A | * | 3/1997 | Sato ........................ | C08F 20/30 252/299.01 |
| 6,671,031 B1 | * | 12/2003 | Nishimura ............ | G02B 5/3016 359/566 |
| 10,527,758 B2 | | 1/2020 | Yoo et al. | |
| 2002/0130995 A1 | * | 9/2002 | Nakanishi .......... | C09K 19/3852 349/177 |
| 2005/0077498 A1 | | 4/2005 | Kato et al. | |
| 2009/0087590 A1 | * | 4/2009 | Aiki ................... | C09K 19/3475 428/1.1 |
| 2009/0323012 A1 | | 12/2009 | He et al. | |
| 2010/0182543 A1 | | 7/2010 | Goto et al. | |
| 2013/0044286 A1 | * | 2/2013 | Yoon ................... | G02F 1/13363 349/194 |
| 2015/0079380 A1 | * | 3/2015 | Muramatsu ........ | C09K 19/2028 428/220 |
| 2019/0101676 A1 | | 4/2019 | Katou et al. | |
| 2020/0033663 A1 | | 1/2020 | Hoshino et al. | |

FOREIGN PATENT DOCUMENTS

| | | |
|---|---|---|
| CN | 101116019 A | 1/2008 |
| CN | 101781570 A | 7/2010 |
| CN | 110537123 A | 12/2019 |
| JP | 10-504848 A | 5/1998 |
| JP | 11-101964 A | 4/1999 |
| JP | 2001-100171 A | 4/2001 |
| JP | 2002-207118 A | 7/2002 |
| JP | 2004-012929 A | 1/2004 |
| JP | 2005-259392 A | 9/2005 |

(Continued)

OTHER PUBLICATIONS

Office Action, issued by the Japanese Patent Office dated Jun. 9, 2020, in connection with Japanese Patent Application No. 2018-559590.
International Search Report Issued in PCT/JP2017/046955 dated Feb. 13, 2018.
Written Opinion Issued in PCT/JP2017/046955 dated Feb. 13, 2018.
International Preliminary Report on Patentability Issued in PCT/JP2017/046955 dated Jul. 2, 2019.
Office Action, issued by the Korean Intellectual Property Office dated Aug. 11, 2020, in connection with Korean Patent Application No. 10-2019-7017760.

(Continued)

*Primary Examiner* — Chanceity N Robinson
*Assistant Examiner* — Anna Malloy
(74) *Attorney, Agent, or Firm* — Edwards Neils LLC; Jean C. Edwards, Esq.

(57) ABSTRACT

A polymer liquid crystal compound with which a light absorption anisotropic film having a high alignment degree can be formed, a liquid crystalline composition, a light absorption anisotropic film which is formed of the liquid crystalline composition, a laminate, and an image display device. The liquid crystalline composition includes a polymer liquid crystal compound which contains a repeating unit represented by Formula (1) and a dichroic substance. In Formula (1), a difference between a log P value of P1, L1, and SP1 and a log P value of M1 is 4 or greater. In Formula (1), P1 represents a main chain of the repeating unit, L1 represents a single bond or a divalent linking group, SP1 represents a spacer group, M1 represents a mesogenic group, and T1 represents a terminal group.

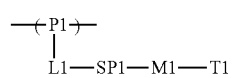

(1)

15 Claims, No Drawings

(56) References Cited

FOREIGN PATENT DOCUMENTS

| JP | 2007-272185 A | 10/2007 |
| JP | 2009-098596 A | 5/2009 |
| JP | 2009-139486 A | 6/2009 |
| JP | 2009-229524 A | 10/2009 |
| JP | 2010-138283 A | 6/2010 |
| JP | 2010-143838 A | 7/2010 |
| JP | 2011-526321 A | 10/2011 |
| JP | 2011-237513 A | 11/2011 |
| WO | 96/06145 A | 2/1996 |
| WO | 03/062286 A1 | 7/2003 |
| WO | 2017/170036 A1 | 10/2017 |

OTHER PUBLICATIONS

Notice of Reasons for Refusal issued by the Japanese Patent Office dated Nov. 24, 2021, in connection with Japanese Patent Application No. 2020-191491.

Office Action, issued by the State Intellectual Property Office dated Apr. 1, 2022, in connection with Chinese Patent Application No. 201780080977.0.

Mielanie Vennes et al., Anisotropic Particles from LC Polymers for Optical Manipulation, Macromolecules, 2006, pp. 8326-8333, vol. 39, American Chemical Society.

Shen Yi et al., Fabrication and Performance of the Liquid Crystal Optical Switches Based on Dichroic Dye and Polymer Orientation, Journal of Optoelectronics, May 2013, pp. 908-911, vol. 24. No. 5, China Academic Journal Electronic Publishing House.

\* cited by examiner

LIQUID CRYSTALLINE COMPOSITION, POLYMER LIQUID CRYSTAL COMPOUND, LIGHT ABSORPTION ANISOTROPIC FILM, LAMINATE, AND IMAGE DISPLAY DEVICE

CROSS-REFERENCE TO RELATED APPLICATIONS

This application is a Continuation of PCT International Application No. PCT/JP2017/046955 filed on Dec. 27, 2017, which was published under Article 21(2) in Japanese, and which claims priority under 35 U.S.C. § 119(a) to Japanese Patent Application No. 2016-255956 filed on Dec. 28, 2016 and Japanese Patent Application No. 2017-145568 filed on Jul. 27, 2017. The above applications are hereby expressly incorporated by reference, in their entirety, into the present application.

BACKGROUND OF THE INVENTION

1. Field of the Invention

The present invention relates to a liquid crystalline composition, a polymer liquid crystal compound, a light absorption anisotropic film, a laminate, and an image display device.

2. Description of the Related Art

In the past, devices which are operated by different principles for each function have been used in a case where an attenuation function, a polarization function, a scattering function, a shielding function, or the like is required in relation to irradiated light including laser light and natural light. Therefore, products corresponding to the above-described functions have been manufactured through different manufacturing processes for each function.

For example, in liquid crystal displays (LCDs), a linearly polarizing plate or a circularly polarizing plate is used to control optical activity and a birefringent property in display. In addition, in organic light emitting diodes (OLEDs), a circularly polarizing plate is used to prevent external light from being reflected.

Iodine has been widely used as a dichroic substance in these polarizing plates (polarizing elements). However, a polarizing element using an organic dye as a dichroic substance instead of iodine has also been examined.

For example, in JP2011-237513A, "a light absorption anisotropic film containing at least one kind of thermotropic liquid crystalline dichroic dye and at least one kind of thermotropic liquid crystalline polymer, in which the mass content of the thermotropic liquid crystalline dichroic dye in the light absorption anisotropic film is 30% or greater" is described (claim 1).

SUMMARY OF THE INVENTION

The inventors have examined the light absorption anisotropic film described in JP2011-237513A, and found that depending on the kind of the thermotropic liquid crystalline polymer used for forming the light absorption anisotropic film, the alignment degree of the light absorption anisotropic film may become insufficient with a reduction in the alignment degree of the dichroic substance and there is room for improvement.

Accordingly, an object of the invention is to provide a polymer liquid crystal compound with which a light absorption anisotropic film having a high alignment degree can be formed, a liquid crystalline composition, a light absorption anisotropic film which is formed of the liquid crystalline composition, a laminate, and an image display device.

As a result of intensive studies for achieving the object, the inventors have found that a light absorption anisotropic film having a high alignment degree can be formed using, as a polymer liquid crystal compound to be mixed together with a dichroic substance, a polymer liquid crystal compound having a repeating unit in which the difference between a log P value from a main chain to a spacer group and a log P value of a mesogenic group is 4 or greater, and completed the invention.

That is, the inventors have found that the object can be achieved with the following configuration.

[1] A liquid crystalline composition comprising: a polymer liquid crystal compound which contains a repeating unit represented by Formula (1); and a dichroic substance, in which in Formula (1), a difference between a log P value of P1, L1, and SP1 and a log P value of M1 is 4 or greater.

In Formula (1), P1 represents a main chain of the repeating unit, L1 represents a single bond or a divalent linking group, SP1 represents a spacer group, M1 represents a mesogenic group, and T1 represents a terminal group.

[2] The liquid crystalline composition according to [1], in which SP1 in Formula (1) includes at least one selected from the group consisting of an oxyethylene structure, an oxypropylene structure, a polysiloxane structure, and a fluorinated alkylene structure.

[3] The liquid crystalline composition according to [1] or [2], in which the polymer liquid crystal compound further contains a repeating unit represented by Formula (2), and in Formula (2), a difference between a log P value of P2, L2, and SP2 and a log P value of M2 is less than 4.

In Formula (2), P2 represents a main chain of the repeating unit, L2 represents a single bond or a divalent linking group, SP2 represents a spacer group, M2 represents a mesogenic group, and T2 represents a terminal group.

[4] The liquid crystalline composition according to any one of [1] to [3], in which the polymer liquid crystal compound further contains a repeating unit represented by Formula (3).

in Formula (3), P3 represents a main chain of the repeating unit, L3 represents a single bond or a divalent linking group, SP3 represents a spacer group, and T3 represents a terminal group.

[5] The liquid crystalline composition according to any one of [1] to [4], in which the polymer liquid crystal compound contains two or more kinds of repeating units represented by Formula (1).

[6] The liquid crystalline composition according to any one of [1] to [5], in which a weight-average molecular weight of the polymer liquid crystal compound is 10,000 or greater.

[7] The liquid crystalline composition according to any one of [1] to [5], in which a weight-average molecular weight of the polymer liquid crystal compound is less than 10,000.

[8] The liquid crystalline composition according to any one of [1] to [7], in which the polymer liquid crystal compound is a star polymer represented by Formula (4).

In Formula (4), $n_A$ represents an integer of 3 or greater, a plurality of PI's each independently represent a polymer chain containing any of the repeating units represented by Formulae (1) to (3), A represents an atomic group which is a core of the star polymer, and at least one of the plurality of PI's represents a polymer chain containing the repeating unit represented by Formula (1).

[9] A polymer liquid crystal compound comprising: a repeating unit represented by Formula (1), in which in Formula (1), a difference between a log P value of P1, L1, and SP1 and a log P value of M is 4 or greater.

In Formula (1), P1 represents a main chain of the repeating unit, L1 represents a single bond or a divalent linking group, SP1 represents a spacer group, M1 represents a mesogenic group, and T1 represents a terminal group.

[10] The polymer liquid crystal compound according to [9], in which SP1 in Formula (1) includes at least one selected from the group consisting of an oxyethylene structure, an oxypropylene structure, a polysiloxane structure, and a fluorinated alkylene structure.

[11] The polymer liquid crystal compound according to [9] or [10], further comprising: a repeating unit represented by Formula (2), in which in Formula (2), a difference between a log P value of P2, L2, and SP2 and a log P value of M2 is less than 4.

In Formula (2), P2 represents a main chain of the repeating unit, L2 represents a single bond or a divalent linking group, SP2 represents a spacer group, M2 represents a mesogenic group, and T2 represents a terminal group.

[12] The polymer liquid crystal compound according to any one of [9] to [11], further comprising: a repeating unit represented by Formula (3).

In Formula (3), P3 represents a main chain of the repeating unit, L3 represents a single bond or a divalent linking group, SP3 represents a spacer group, and T3 represents a terminal group.

[13] The polymer liquid crystal compound according to any one of [9] to [12], comprising: two or more kinds of repeating units represented by Formula (1).

[14] The polymer liquid crystal compound according to any one of [9] to [13], in which a weight-average molecular weight of the polymer liquid crystal compound is 10,000 or greater.

[15] The polymer liquid crystal compound according to any one of [9] to [13], in which a weight-average molecular weight of the polymer liquid crystal compound is less than 10,000.

[16] The polymer liquid crystal compound according to any one of [9] to [15], which is a star polymer represented by Formula (4).

In Formula (4), $n_A$ represents an integer of 3 or greater, a plurality of PI's each independently represent a polymer chain containing any of the repeating units represented by Formulae (1) to (3), A represents an atomic group which is a core of the star polymer, and at least one of the plurality of PI's represents a polymer chain containing the repeating unit represented by Formula (1).

[17] A light absorption anisotropic film which is formed using the liquid crystalline composition according to any one of [1] to [8].

[18] A laminate comprising: a base; and the light absorption anisotropic film according to [17] which is provided on the base.

[19] The laminate according to [18], further comprising: λ/4 plate which is provided on the light absorption anisotropic film.

[20] An image display device comprising: the light absorption anisotropic film according to [17]; or the laminate according to [18] or [19].

According to the invention, it is possible to provide a polymer liquid crystal compound with which a light absorption anisotropic film having a high alignment degree can be formed, a liquid crystalline composition, a light absorption anisotropic film which is formed of the liquid crystalline composition, a laminate, and an image display device.

DESCRIPTION OF THE PREFERRED EMBODIMENTS

Hereinafter, the invention will be described.

The following description of constituent requirements is based on typical embodiments of the invention, but the invention is not limited thereto.

In this specification, a numerical value range expressed using "to" means a range including numerical values before and after "to" as a lower limit value and an upper limit value.

In this specification, the term (meth)acrylic acid is a generic term for "acrylic acid" and "methacrylic acid", and the term (meth)acryloyl is a generic term for "acryloyl" and "methacryloyl".

[Liquid Crystalline Composition]

A liquid crystalline composition according to the embodiment of the invention contains a polymer liquid crystal compound containing a repeating unit represented by Formula (1) and a dichroic substance. In Formula (1), the difference between a log P value of P1 (hereinafter, also referred to as "main chain"), L1, and SP1 (hereinafter, also referred to as "spacer group") and a log P value of M1 (hereinafter, also referred to as "mesogenic group") is 4 or greater.

According to the embodiment of the liquid crystalline composition of the invention, a light absorption anisotropic film having a high alignment degree can be formed. The reason for this is not clear in detail, but roughly presumed as follows.

The log P value is an index indicating the hydrophilic property and the hydrophobic property of a chemical structure. In the repeating unit represented by Formula (1), the log P value of the main chain, L1, and the spacer group and the log P value of the mesogenic group are separated by a predetermined value or greater, and thus the compatibility between the structure from the main chain to the spacer group and the mesogenic group is low. Accordingly, it is presumed that the crystallinity of the polymer liquid crystal compound increases, and the alignment degree of the polymer liquid crystal compound is thus high. As described above, in a case where the polymer liquid crystal compound has a high alignment degree, it is presumed that the compatibility between the polymer liquid crystal compound and the dichroic substance is lowered (that is, the crystallinity of the dichroic substance is improved), and thus the alignment degree of the dichroic substance is improved. As a result, the alignment degree of a light absorption anisotropic film to be obtained is thought to be increased.

[Polymer Liquid Crystal Compound]

<Repeating Unit (1)>

The polymer liquid crystal compound according to the embodiment of the invention contains a repeating unit (also referred to as "repeating unit (1)" in this specification) represented by Formula (1). In the repeating unit (1), the difference between the log P value of P1, L1, and SP1 and the log P value of M1 is 4 or greater.

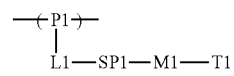

(1)

In Formula (1), P1 represents a main chain of the repeating unit, L1 represents a single bond or a divalent linking group, SP1 represents a spacer group, M1 represents a mesogenic group, and T1 represents a terminal group.

Specific examples of the main chain of the repeating unit represented by P1 include groups represented by Formulae (P1-A) to (P1-D). Among these, groups represented by Formula (P1-A) are preferable from the viewpoint of diversity of monomers as raw materials and ease of handling.

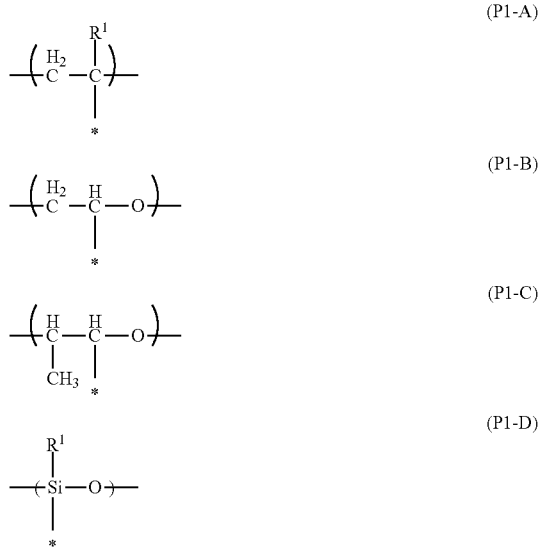

(P1-A)

(P1-B)

(P1-C)

(P1-D)

In Formulae (P1-A) to (P1-D), "*" represents a bonding position to L1 in Formula (1). In formula (P1-A), $R^1$ represents a hydrogen atom or a methyl group. In Formula (P1-D), $R^2$ represents an alkyl group.

The group represented by Formula (P1-A) is preferably a unit of a partial structure of a poly(meth)acrylic acid ester obtained by polymerizing a (meth)acrylic acid ester.

The group represented by Formula (P1-B) is preferably an ethylene glycol unit in polyethylene glycol obtained by polymerizing ethylene glycol.

The group represented by Formula (P1-C) is preferably a propylene glycol unit obtained by polymerizing propylene glycol.

The group represented by Formula (P1-D) is preferably a siloxane unit of polysiloxane obtained by polycondensing silanol. Here, the silanol is a compound represented by Formula $Si(R^2)_3(OH)$. In the formula, a plurality of $R^2$'s each independently represent a hydrogen atom or an alkyl group. At least one of the plurality of $R^2$'s represents an alkyl group.

L1 is a single bond or a divalent linking group.

Examples of the divalent linking group represented by L1 include —C(O)O—, —OC(O)—, —O—, —S—, —C(O)NR³—, —NR³C(O)—, —S(O)₂—, and —NR³R⁴—. In the formula, $R^3$ and $R^4$ each independently represent a hydrogen atom or an alkyl group having 1 to 6 carbon atoms which may have a substituent. In the specific examples of the divalent linking group, a left bonding hand is bonded to P1, and a right bonding hand is bonded to SP1.

In a case where P1 is a group represented by Formula (P1-A), L1 is preferably a group represented by —C(O)O—.

In a case where P1 is a group represented by any one of Formula (P1-B), (P1-C), or (P1-D), L1 is preferably a single bond.

The spacer group represented by SP1 preferably includes at least one selected from the group consisting of an oxyethylene structure, an oxypropylene structure, a polysiloxane structure, and a fluorinated alkylene structure from the viewpoint of easy exhibition of liquid crystallinity, raw material availability, and the like.

Here, the oxyethylene structure represented by SP1 is preferably a group represented by $*-(CH_2-CH_2O)_{n1}-*$. In the formula, n1 represents an integer of 1 to 20, and * represents a bonding position to L1 or M1. n1 is preferably an integer of 2 to 10, more preferably an integer of 2 to 4, and most preferably 3 since the effects of the invention are further enhanced. The oxypropylene structure represented by SP1 is preferably a group represented by $*-(CH(CH_3)-CH_2O)_{n2}-*$. In the formula, n2 represents an integer of 1 to 3, and * represents a bonding position to L1 or M1.

The polysiloxane structure represented by SP1 is preferably a group represented by $*-(Si(CH_3)_2-O)_{n3}-*$. In the formula, n3 represents an integer of 6 to 10, and * represents a bonding position to L1 or M1.

The fluorinated alkylene structure represented by SP1 is preferably a group represented by $*-(CF_2-CF_2)_4-*$. In the formula, n4 represents an integer of 6 to 10, and * represents a bonding position to L1 or M1.

The mesogenic group represented by M1 is a group showing the main skeleton of liquid crystal molecules contributing to the formation of liquid crystal. The liquid crystal molecules exhibit liquid crystallinity in an intermediate state (mesophase) between a crystalline state and an isotropic liquid state. The mesogenic group is not particularly limited, and for example, the description on pages 7 to 16 of "Flussige Kristalle in Tabellen II" (VEB Deutsche Verlag fur Grundstoff Industrie, Leipzig, 1984) and the description in Chapter 3 of Liquid Crystal Handbook (Maruzen, 2000) edited by Liquid Crystal Handbook Editing Committee can be referred to.

The mesogenic group is preferably a group having at least one cyclic structure selected from the group consisting of an aromatic hydrocarbon group, a heterocyclic group, and an alicyclic group.

The mesogenic group preferably has an aromatic hydrocarbon group, more preferably has 2 to 4 aromatic hydrocarbon groups, and even more preferably has 3 aromatic hydrocarbon groups since the effects of the invention are further enhanced.

The mesogenic group is preferably a group represented by Formula (M1-A) or (M1-B), and more preferably a group represented by Formula (M1-B) from the viewpoint of exhibition of liquid crystallinity, adjustment of a liquid crystal phase transition temperature, raw material availability, synthesis suitability, and a further enhancement in the effects of the invention.

(M1-A)

(M1-B)

In Formula (M1-A), A1 is a divalent group selected from the group consisting of an aromatic hydrocarbon group, a heterocyclic group, and an alicyclic group. These groups may be substituted by a substituent such as an alkyl group, a fluorinated alkyl group, or an alkoxy group.

The divalent group represented by A1 is preferably a 4- to 6-membered ring. The divalent group represented by A1 may be monocyclic or condensed.

* represents a bonding position to SP1 or T1.

Examples of the divalent aromatic hydrocarbon group represented by A1 include a phenylene group, a naphthylene group, a fluorene-diyl group, an anthracene-diyl group, and a tetracene-diyl group, and from the viewpoint of diversity of the design of a mesogenic skeleton and raw material availability, a phenylene group or a naphthylene group is preferable, and a phenylene group is more preferable.

The divalent heterocyclic group represented by A1 may be aromatic or non-aromatic, and is preferably a divalent aromatic heterocyclic group from the viewpoint of a further improvement in the alignment degree.

Examples of the atoms other than the carbon atom of the divalent aromatic heterocyclic group include a nitrogen atom, a sulfur atom, and an oxygen atom. In a case where the aromatic heterocyclic group has a plurality of ring-constituting atoms other than the carbon atom, these may be the same or different.

Specific examples of the divalent aromatic heterocyclic group include a pyridylene group (pyridine-diyl group), a pyridazine-diyl group, an imidazole-diyl group, a thienylene (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 is 2 or greater, a plurality of A1's may be the same or different.

In Formula (M1-B), A2 and A3 each independently represent a divalent group selected from the group consisting of an aromatic hydrocarbon group, a heterocyclic group, and an alicyclic group. Since specific examples and preferable aspects of A2 and A3 are the same as those of A1 of Formula (M1-A), the description thereof will be omitted.

In Formula (M1-B), a2 represents an integer of 1 to 10. In a case where a2 is 2 or greater, a plurality of A2's may be the same or different, a plurality of A3's may be the same or different, and a plurality of LA1's may be the same or different. a2 is preferably an integer of 2 or greater, and more preferably 2 since the effects of the invention are further enhanced.

In Formula (M1-B), in a case where a2 is 1, LA1 is a divalent linking group. In a case where a2 is 2 or greater, a plurality of LA1's each independently represent a single bond or a divalent linking group, and at least one of the plurality of LA1's is a divalent linking group. In a case where a2 is 2, it is preferable that one of two LA1's is a divalent linking group and the other is a single bond since the effects of the invention are further enhanced.

Examples of the divalent linking group represented by LA1 in Formula (M1-B) include —O—, —(CH$_2$)$_g$—, —(CF$_2$)$_g$—, —Si(CH$_3$)$_2$—, —(Si(CH$_3$)$_{20}$)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z,Z',Z" each independently represent hydrogen, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, —C(O)O— is preferable since the effects of the invention are further enhanced. LA1 may be a group formed by combining two or more of the above groups.

Specific examples of M1 include the following structures. In the following specific examples, "Ac" represents an acetyl group.

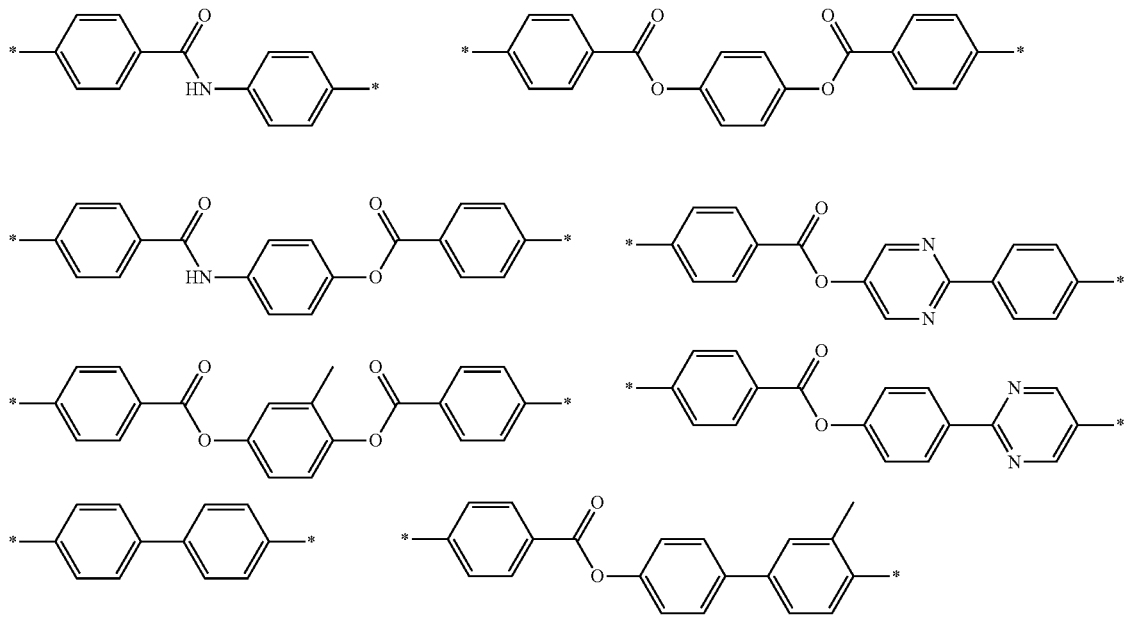

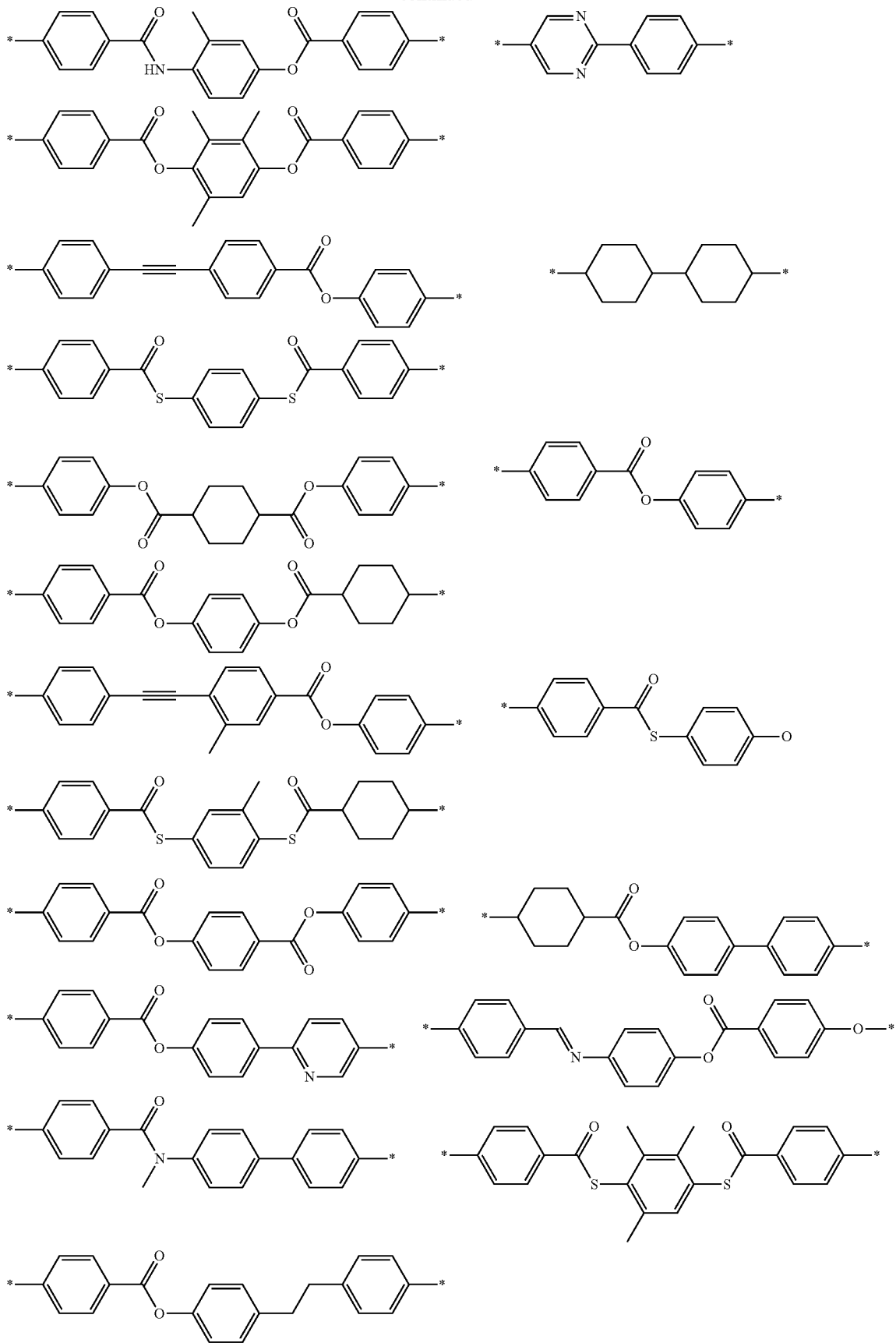

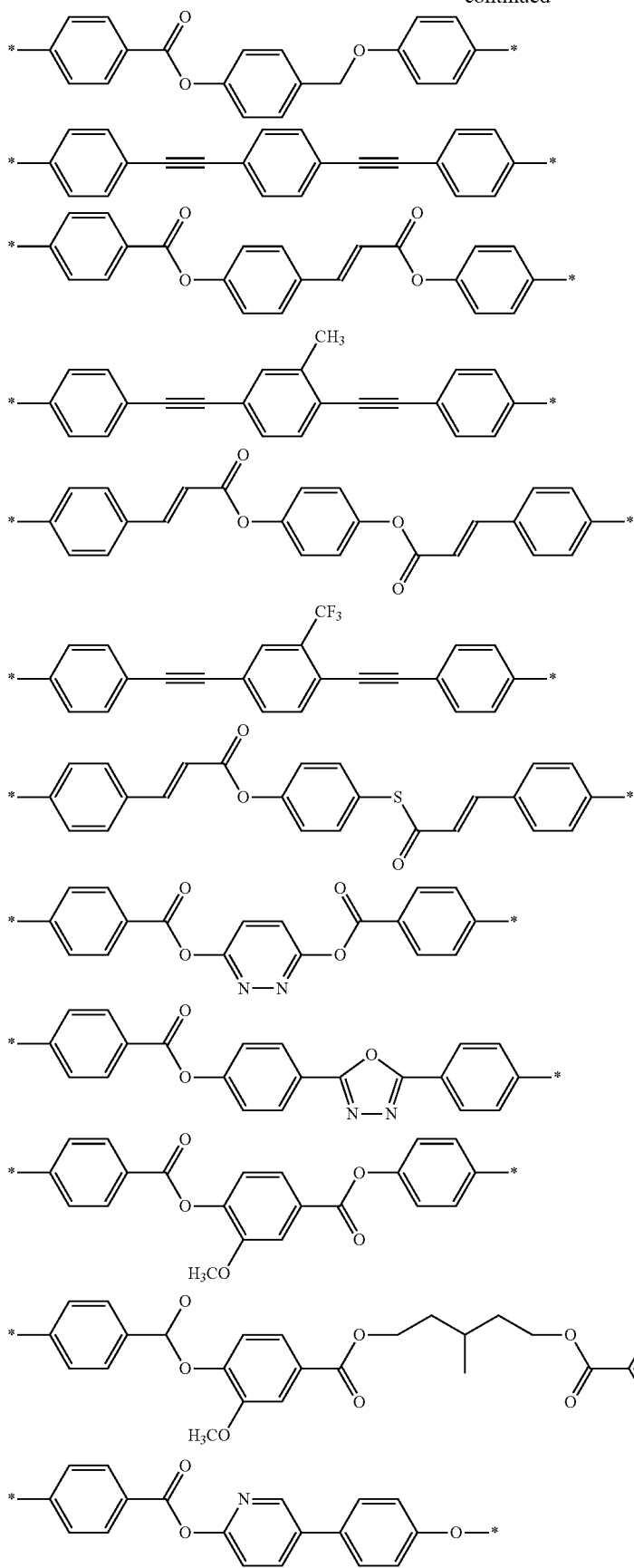

-continued
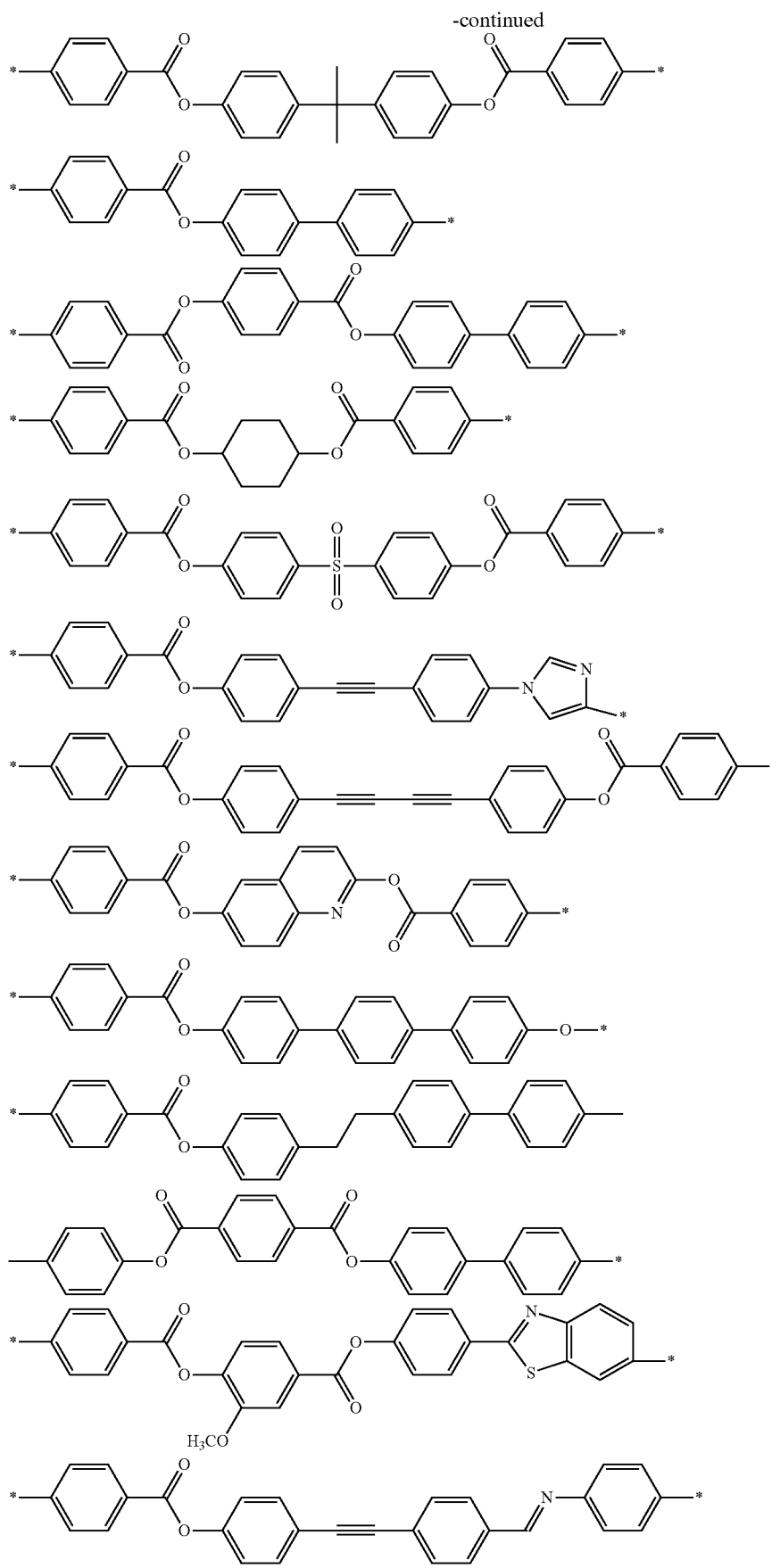

-continued
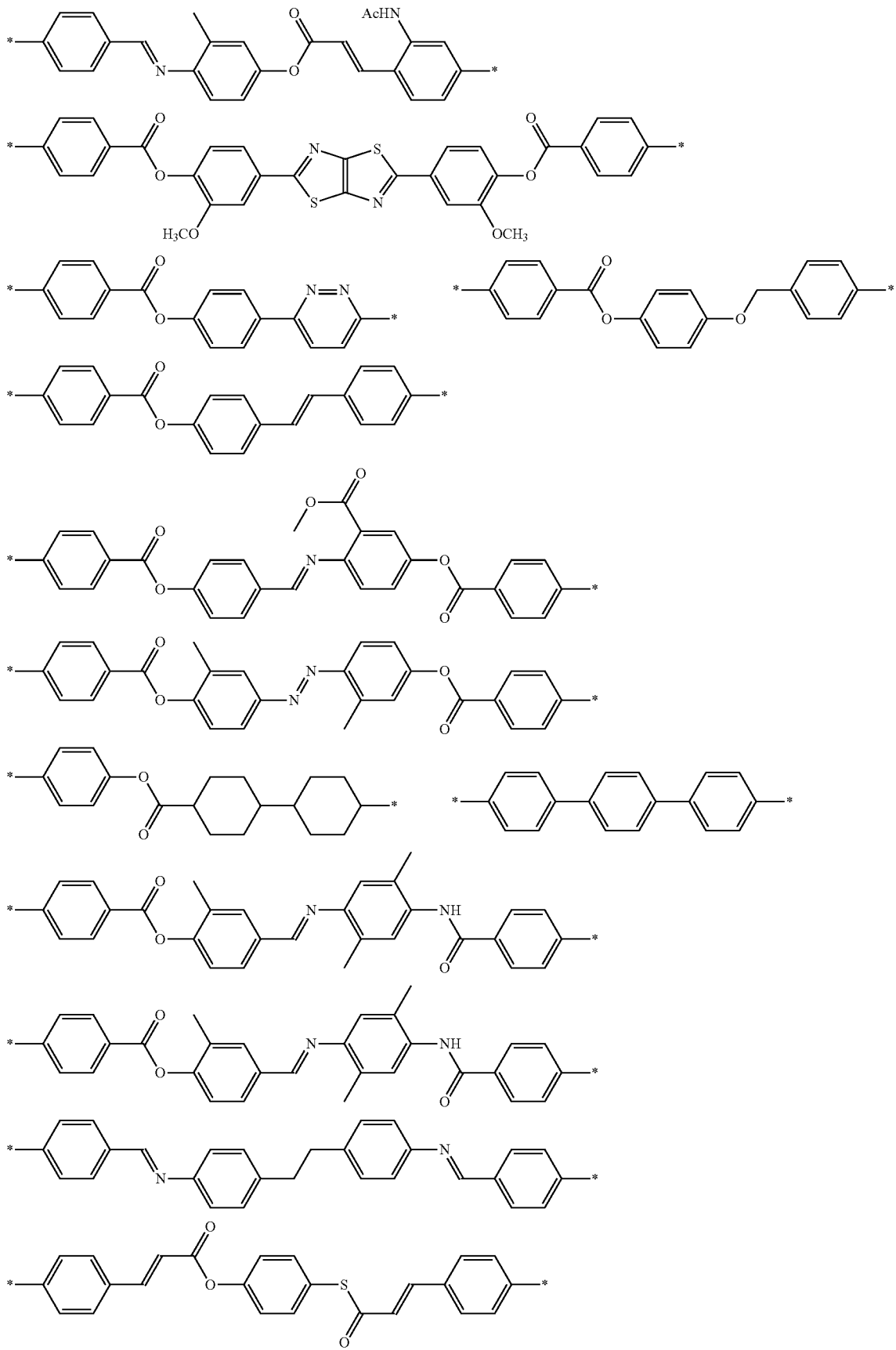

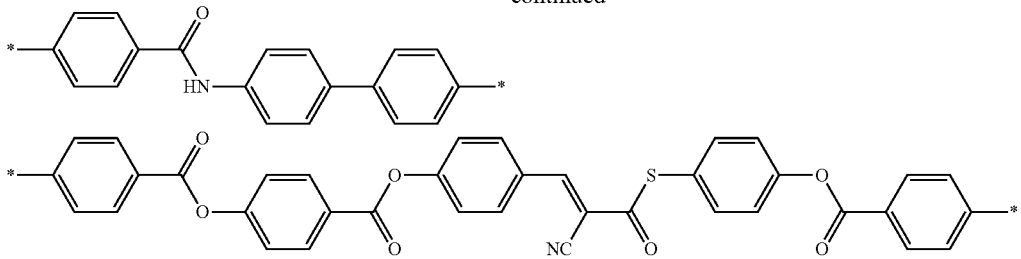

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R is an alkyl group), an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group. Specific examples of the linking group are the same as those described for L1 and SP1. A represents a (meth)acryloyloxy group).

T1 is preferably an alkoxy group having 1 to 10 carbon atoms, more preferably an alkoxy group having 1 to 5 carbon atoms, and even more preferably a methoxy group since the effects of the invention are further enhanced. These terminal groups may be further substituted by the above groups or the polymerizable groups described in JP2010-244038A.

The number of atoms in the main chain of T1 is preferably 1 to 20, more preferably 1 to 15, even more preferably 1 to 10, and particularly preferably 1 to 7 since the effects of the invention are further enhanced. In a case where the number of atoms in the main chain of T1 is 20 or less, the alignment degree of a light absorption anisotropic film is further improved. Here, the "main chain" of T1 means the longest molecular chain bonded to M1, and hydrogen atoms are not counted as the number of atoms in the main chain of T1. For example, in a case where T1 is an n-butyl group, the main chain has 4 atoms, and in a case where T1 is a sec-butyl group, the main chain has 3 atoms.

The content of the repeating unit (1) is preferably 20 to 100 mass %, more preferably 30 to 99.9 mass %, and even more preferably 40 to 99.0 mass % with respect to a total of 100 mass % of the repeating units of the polymer liquid crystal compound since the effects of the invention are further enhanced.

In the invention, the content of each repeating unit contained in the polymer liquid crystal compound is calculated based on the amount (mass) of each monomer fed for obtaining each repeating unit.

The polymer liquid crystal compound may contain only one kind of repeating unit (1) or two or more kinds of repeating units (1). Containing two or more kinds of repeating units (1) in the polymer liquid crystal compound is advantageous in that the solubility of the polymer liquid crystal compound in a solvent is improved and the liquid crystal phase transition temperature is easily adjusted. In a case where two or more kinds of repeating units (1) are contained, the total amount thereof is preferably within the above range.

In a case where two or more kinds of repeating units (1) are contained, a repeating unit (1) in which T1 does not include a polymerizable group and a repeating unit (1) in which T1 includes a polymerizable group may be used in combination. This further improves the curability of a light absorption anisotropic film.

In this case, in the polymer liquid crystal compound, a ratio of the repeating unit (1) in which T1 includes a polymerizable group to the repeating unit (1) in which T1 does not include a polymerizable group (repeating unit (1) in which T1 includes polymerizable group/repeating unit (1) in which T1 does not include polymerizable group) is preferably 0.005 to 4, and more preferably 0.01 to 2.4 in terms of mass ratio. In a case where the mass ratio is 4 or less, there is an advantage in that an excellent alignment degree is obtained. In a case where the mass ratio is 0.05 or greater, the curability of a light absorption anisotropic film is further improved.

(log P Value)

In Formula (1), the difference ($|\log P_1 - \log P_2|$) between the log P value of P1, L1, and SP1 (hereinafter, also referred to as "log $P_1$") and the log P value of M1 (hereinafter, also referred to as "log P2") is 4 or greater, and from the viewpoint of a further improvement in the alignment degree of a light absorption anisotropic film, the difference is preferably 4.25 or greater, and more preferably 4.5 or greater.

The upper limit value of the difference is preferably 15 or less, more preferably 12 or less, and even more preferably 10 or less from the viewpoint of adjustment of a liquid crystal phase transition temperature and synthesis suitability.

Here, the log P value is an index indicating the hydrophilic property and the hydrophobic property of a chemical structure, and may be referred to as the hydrophilic-hydrophobic parameter. The log P value can be calculated using software such as ChemBioDraw Ultra or HSPiP (Ver. 4.1.07). In addition, the log P value can be obtained experimentally by the method in OECD Guidelines for the Testing of Chemicals, Sections 1, Test No. 117, etc. In the invention, the value calculated by inputting a structural formula of a compound to HSPiP (Ver. 4.1.07) is employed as a log P value unless otherwise noted.

As described above, log $P_1$ means the log P value of P1, L1, and SP1. The "log P value of P1, L1, and SP1" means a log P value of a structure in which P1, L1, and SP1 are integrated, not a sum of the respective log P values of P1, L1 and SP1. Specifically, log $P_1$ is calculated by inputting a set of structural formulae from P1 to SP1 in Formula (1) to the software.

In calculating log $P_1$, regarding the group moiety represented by P1 in the set of structural formulae from P1 to SP1, the structure of the group represented by P1 itself (for example, Formulae (P1-A) to (P1-D) described above) may be used, or the structure of a group capable of becoming P1 after polymerization of a monomer used for obtaining the repeating unit represented by Formula (1) may be used.

Here, specific examples of the latter (group capable of becoming P1) are as follows. The group is a group represented by $CH_2=C(R^1)-$ ($R^1$ represents a hydrogen atom or a methyl group) in a case where P1 is obtained by polymerizing a (meth)acrylic acid ester. In addition, in a case where P1 is obtained by polymerizing ethylene glycol, the group is ethylene glycol, and in a case where P1 is obtained by polymerizing propylene glycol, the group is propylene glycol. In addition, in a case where P1 is obtained by polycondensing silanol, the group is silanol (a compound represented by Formula $Si(R^2)_3(OH)$. A plurality of $R^2$'s each independently represent a hydrogen atom or an alkyl group, and at least one of the plurality of $R^2$'s represents an alkyl group).

Log $P_1$ may be lower or higher than log $P_2$ as long as the difference between Log $P_1$ and log P2 described above is 4 or greater.

Here, there is a tendency that a log P value of a general mesogenic group (log P2 described above) is within a range of 4 to 6. In this case, in a case where log P2 is lower than log P2, the value of log $P_1$ is preferably 1 or less, and more preferably 0 or less. In a case where log $P_1$ is higher than log P2, the value of log $P_1$ is preferably 8 or greater, and more preferably 9 or greater.

In a case where P1 in Formula (1) is obtained by polymerizing a (meth)acrylic acid ester and log $P_1$ is lower than log P2, the log P value of SP1 in Formula (1) is preferably 0.7 or less, and more preferably 0.5 or less. In a case where P1 in Formula (1) is obtained by polymerizing a (meth)acrylic acid ester and log $P_1$ is higher than log $P_2$, the log P value of SP1 in Formula (1) is preferably 3.7 or greater, and more preferably 4.2 or greater.

Examples of the structure in which the log P value is 1 or less include an oxyethylene structure and an oxypropylene structure. Examples of the structure in which the log P value is 6 or greater include a polysiloxane structure and a fluorinated alkylene structure.

<Repeating Unit (2)>

The polymer liquid crystal compound according to the embodiment of the invention may further contain a repeating unit represented by Formula (2) (also referred to as "repeating unit (2)" in this specification). This is advantageous in that the solubility of the polymer liquid crystal compound in a solvent is improved and the liquid crystal phase transition temperature is easily adjusted.

In Formula (2), the difference between the log P value of P2, L2, and SP2 and the log P value of M2 is less than 4. That is, the repeating unit (2) is different from the repeating unit (1) in terms of at least the difference in log P value in the structure.

Since the definition of the "log P value of P2, L2 and SP2" is the same as that of log $P_1$ described above, the description thereof will be omitted.

In a case where the polymer liquid crystal compound contains the repeating unit (2), the polymer liquid crystal compound is a copolymer of the repeating unit (1) and the repeating unit (2), and may be any one of a block polymer, an alternating polymer, a random polymer, or a graft polymer.

In Formula (2), P2 represents a main chain of the repeating unit, L2 represents a single bond or a divalent linking group, SP2 represents a spacer group, M2 represents a mesogenic group, and T2 represents a terminal group.

Specific examples of each of P2, L2, SP2, M2, and T2 in Formula (2) are the same as those described for each of P1, L1, SP1, M1, and T1 in Formula (1).

Here, T2 in Formula (2) preferably has a polymerizable group from the viewpoint of an improvement in the strength of a light absorption anisotropic film.

In a case where the repeating unit (2) is contained, the content thereof is preferably 0.5 to 50 mass %, and more preferably 1 to 40 mass % with respect to a total of 100 mass % of the repeating units of the polymer liquid crystal compound.

The polymer liquid crystal compound may contain only one kind of repeating unit (2) or two or more kinds of repeating units (2). In a case where two or more kinds of repeating units (2) are contained, the total amount thereof is preferably within the above range.

Particularly, in a case where T2 in the repeating unit (2) has a polymerizable group, the content of the repeating unit (2) in which T2 has a polymerizable group is preferably 0.5 to 60 mass %, and more preferably 1 to 40 mass % with respect to a total of 100 mass % of the repeating units of the polymer liquid crystal compound. In a case where the content of the repeating unit (2) in which T2 has a polymerizable group is 0.5 mass % or greater, the strength of a light absorption anisotropic film is further improved. In a case where the content of the repeating unit (2) in which T2 has a polymerizable group is 60 mass % or less, there is an advantage in that the alignment degree is further improved.

<Repeating Unit (3)>

The polymer liquid crystal compound according to the embodiment of the invention may further contain a repeating unit represented by Formula (3) (also referred to as "repeating unit (3)" in this specification). This is advantageous in that the solubility of the polymer liquid crystal compound in a solvent is improved and the liquid crystal phase transition temperature is easily adjusted.

The repeating unit (3) is different from the repeating unit (1) and the repeating unit (2) in that it does not have at least a mesogenic group.

In a case where the polymer liquid crystal compound contains the repeating unit (3), the polymer liquid crystal compound is a copolymer of the repeating unit (1) and the repeating unit (3) (may also be a copolymer containing the repeating unit (2)), and may be any one of a block polymer, an alternating polymer, a random polymer, or a graft polymer.

In Formula (3), P3 represents a main chain of the repeating unit, L3 represents a single bond or a divalent linking group, SP3 represents a spacer group, and T3 represents a terminal group.

Specific examples of each of P3, L3, SP3, and T3 in Formula (3) are the same as those described for each of P1, L1, SP1, and T1 in Formula (1).

Here, T3 in Formula (3) preferably has a polymerizable group from the viewpoint of an improvement in the strength of a light absorption anisotropic film.

In a case where the repeating unit (3) is contained, the content thereof is preferably 0.5 to 40 mass %, and more preferably 1 to 30 mass % with respect to a total of 100 mass % of the repeating units of the polymer liquid crystal compound.

The polymer liquid crystal compound may contain only one kind of repeating unit (3) or two or more kinds of repeating units (3). In a case where two or more kinds of repeating units (3) are contained, the total amount thereof is preferably within the above range.

Particularly, in a case where T3 in the repeating unit (3) has a polymerizable group, the content of the repeating unit (3) in which T3 has a polymerizable group is preferably 0.5 to 60 mass %, and more preferably 1 to 40 mass % with respect to a total of 100 mass % of the repeating units of the polymer liquid crystal compound. In a case where the content of the repeating unit (3) in which T13 has a polymerizable group is 0.5 mass % or greater, the strength of a light absorption anisotropic film is further improved. In a case where the content of the repeating unit (3) in which T3 has a polymerizable group is 60 mass % or less, there is an advantage in that an excellent alignment degree is obtained.

<Star Polymer>

The polymer liquid crystal compound according to the embodiment of the invention may be a star polymer. In the invention, the star polymer means a polymer having three or more polymer chains extending from the core as a starting point. Specifically, the star polymer is represented by Formula (4).

The star polymer represented by Formula (4) as the polymer liquid crystal compound can form a light absorption anisotropic film having high solubility (excellent solubility in a solvent) and a high alignment degree.

  (4)

In Formula (4), $n_A$ represents an integer of 3 or greater, and is preferably an integer of 4 or greater. The upper limit value of $n_A$ is not limited thereto. The upper limit value of $n_A$ is usually 12 or less, and preferably 6 or less.

A plurality of PI's each independently represent a polymer chain containing any of the repeating units represented by Formulae (1) to (3). At least one of the plurality of PI's represents a polymer chain containing the repeating unit represented by Formula (1).

All of the plurality of PI's are preferably polymer chains containing a repeating unit represented by Formula (1).

A represents an atomic group which is a core of the star polymer. Specific examples of A include a structure in which a hydrogen atom is removed from a thiol group of the polyfunctional thiol compound described in paragraphs [0052] to [0058] of JP2011-074280A, paragraphs [0017] to [0021] of JP2012-189847A, paragraphs [0012] to [0024] of JP2013-031986A, or paragraphs [0118] to [0142] of JP2014-104631A. In this case, A and PI are bonded by a sulfide bond.

The number of thiol groups of the polyfunctional thiol compound from which A is derived is preferably 3 or greater, and more preferably 4 or greater. The upper limit value of the number of thiol groups of the polyfunctional thiol compound is usually 12 or less, and preferably 6 or less.

Specific examples of the polyfunctional thiol compound are as follows.

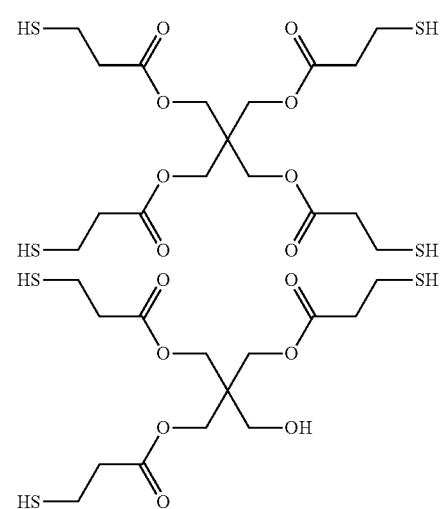

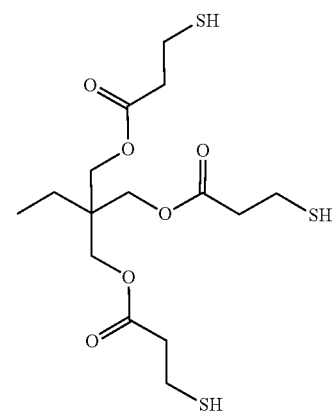

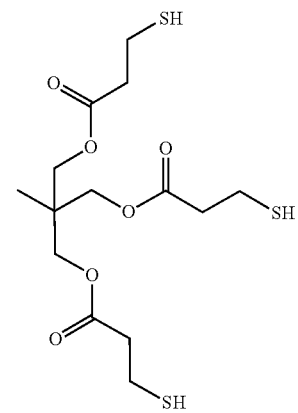

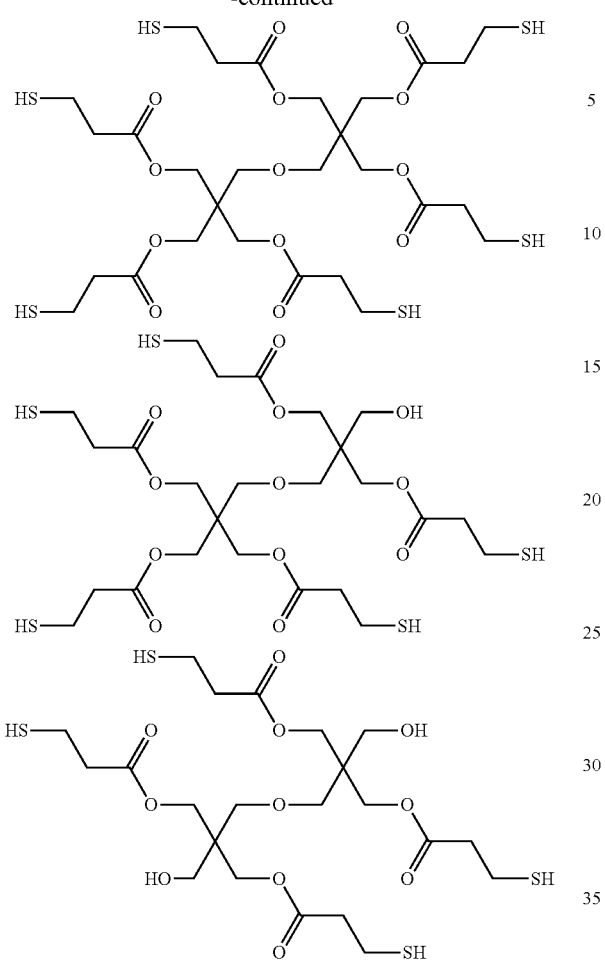
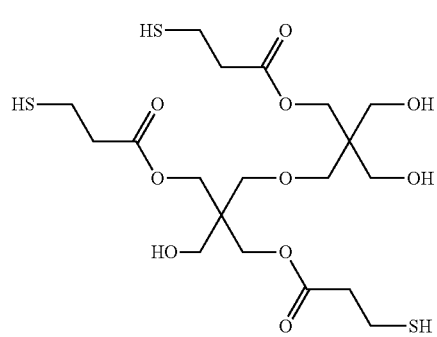
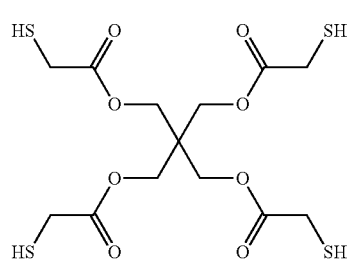
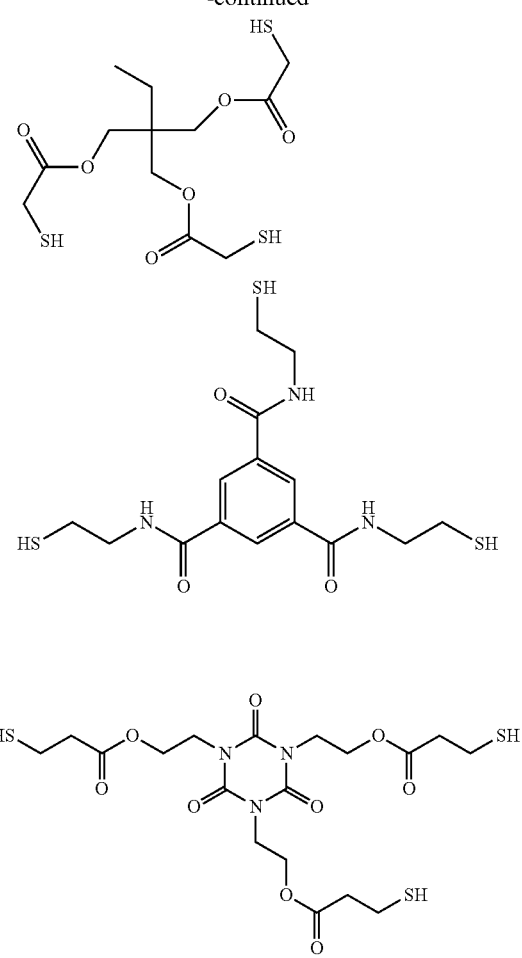
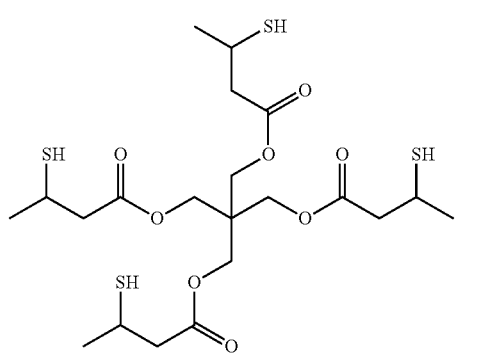

-continued

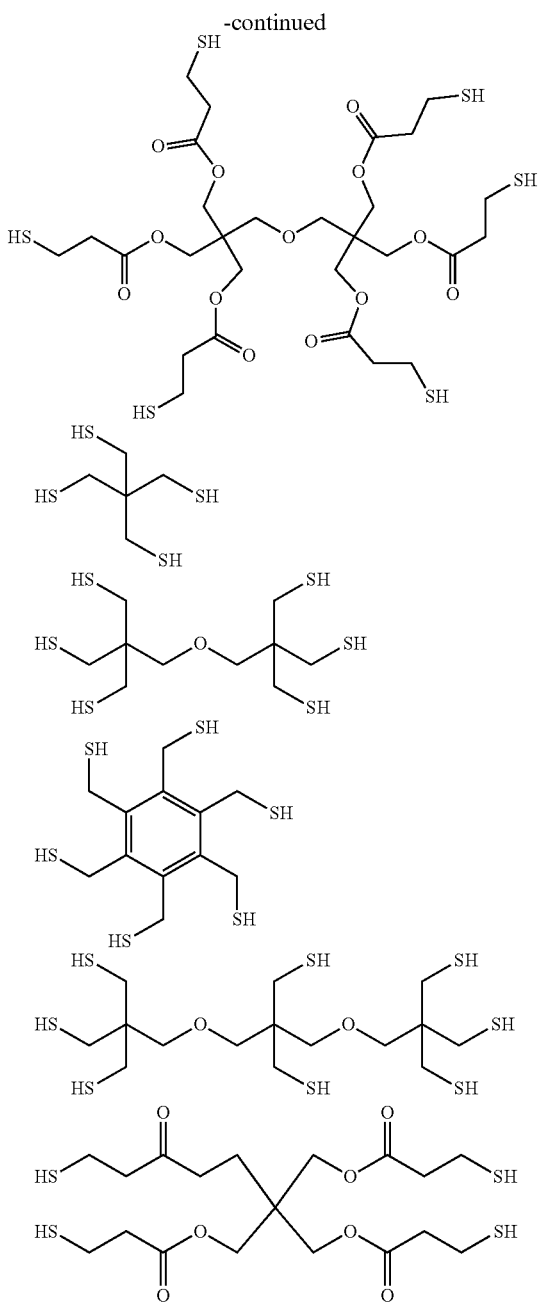

<Physical Properties>

A weight-average molecular weight (Mw) of the polymer liquid crystal compound is preferably 1,000 to 500,000, and more preferably 2,000 to 300,000. In a case where Mw of the polymer liquid crystal compound is within the above range, handling of the polymer liquid crystal compound is facilitated.

Particularly, from the viewpoint of suppression of cracks during coating, the weight-average molecular weight (Mw) of the polymer liquid crystal compound is preferably 10,000 or greater, and more preferably 10,000 to 300,000.

From the viewpoint of the temperature latitude of the alignment degree, the weight-average molecular weight (Mw) of the polymer liquid crystal compound is preferably less than 10,000, and more preferably 2,000 to less than 10,000.

Here, in the invention, the weight-average molecular weight and the number average molecular weight are values measured by gel permeation chromatography (GPC).

Solvent (eluant): N-methylpyrrolidone
Device Name: TOSOH HLC-8220GPC
Column: Three columns (TOSOH TSKgelSuperAWM-H (6 mm×15 cm)) are connected and used.
Column Temperature: 25° C.
Sample Concentration: 0.1 mass %
Flow Rate: 0.35 mL/min
Calibration Curve: Using a calibration curve obtained using 7 TSK standard polystyrene samples manufactured by TOSOH Corporation Mw=2,800,000 to 1,050 (Mw/Mn=1.03 to 1.06)

The liquid crystallinity of the polymer liquid crystal compound may be either nematic or smectic, but is preferably at least nematic.

The temperature range in which a nematic phase is exhibited is preferably room temperature (23° C.) to 450° C., and is preferably 50° C. to 400° C. from the viewpoint of handling and manufacturing suitability.

[Dichroic Substance]

The dichroic substance contained in the liquid crystalline composition according to the embodiment of the invention is not particularly limited, and examples thereof include visible light absorbing substances (dichroic dye), light emitting substances (fluorescent substance, phosphorescent substance), ultraviolet absorbing substances, infrared absorbing substances, nonlinear optical substances, carbon nanotubes, and inorganic substances (for example, quantum rods). Dichroic substances (dichroic dyes) which have been known can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0022] to [0080] of JP2015-001425, paragraphs [0005] to [0051] of JP2016-006502, paragraphs [0005] to [0041] of WO2016/060173A, paragraphs [0008] to [0062] of WO2016/136561A, paragraphs [0014] to [0033] of JP2016-044909, paragraphs [0014] to [0033] of JP2016-044910, paragraphs [0013] to [0037] of JP2016-095907, and paragraphs [0014] to [0034] of JP2017-045296.

In the invention, two or more kinds of dichroic substances may be used in combination. For example, from the viewpoint of making a color of the light absorption anisotropic film close to black, at least one kind of dye compound having a maximum absorption wavelength in a wavelength range of 370 to 550 nm, and at least one kind of dye compound having a maximum absorption wavelength in a wavelength range of 500 to 700 nm are preferably used in combination.

In the invention, the dichroic substance preferably has a crosslinking group since the pressing resistance is further improved.

Specific examples of the crosslinking group include a (meth)acryloyl group, an epoxy group, an oxetanyl group, and a styryl group, and among these, a (meth)acryloyl group is preferable.

In the invention, the content of the dichroic substance is preferably 2 to 400 parts by mass, more preferably 3 to 300 parts by mass, and even more preferably 4 to 200 parts by mass with respect to 100 parts by mass of the polymer compound from the viewpoint of an improvement in the balance between the alignment degree and the uniformity of a light absorption anisotropic film.

[Polymerization Initiator]

The liquid crystalline composition used in the invention preferably contains a polymerization initiator.

The polymerization initiator is not particularly limited, and a photosensitive compound, that is, a photopolymerization initiator is preferable.

As the photopolymerization initiator, various kinds of compounds can be used with no particular limitation. Examples of the photopolymerization initiator include α-carbonyl compounds (the specifications of U.S. Pat. Nos. 2,367,661A and 2,367,670A), acyloin ethers (the specification of U.S. Pat. No. 2,448,828A), aromatic acyloin compounds substituted by α-hydrocarbon (the specification of U.S. Pat. No. 2,722,512A), polynuclear quinone compounds (the specifications of U.S. Pat. Nos. 3,046,127A and 2,951,758A), combinations of triarylimidazole dimers and p-aminophenyl ketones (the specification of U.S. Pat. No. 3,549,367A), acridine and phenazine compounds (the specifications of JP1985-105667A (JP-S60-105667A) and U.S. Pat. No. 4,239,850A), oxadiazole compounds (the specification of U.S. Pat. No. 4,212,970A), and acylphosphine oxide compounds (JP1988-40799B (JP-S63-40799B), JP1993-29234B (JP-H5-29234B), JP1998-95788B (JP-H10-95788B), and JP1998-29997B (JP-H10-29997B)).

A commercially available product can also be used as the photopolymerization initiator, and examples thereof include IRGACURE 184, 907, 369, 651, 819, OXE-01, and OXE-02 manufactured by BASF SE.

In a case where the liquid crystalline composition according to the embodiment of the invention contains a polymerization initiator, the content of the polymerization initiator is preferably 0.01 to 30 parts by mass, and more preferably 0.1 to 15 parts by mass with respect to a total of 100 parts by mass of the dichroic substance and the polymer liquid crystal compound in the liquid crystalline composition. In a case where the content of the polymerization initiator is 0.01 parts by mass or greater, the durability of a light absorption anisotropic film is improved, and in a case where the content of the polymerization initiator is 30 parts by mass or less, the alignment of a light absorption anisotropic film is improved.

[Solvent]

From the viewpoint of workability and the like, the liquid crystalline composition according to the embodiment of the invention preferably contains a solvent.

Examples of the solvent include organic solvents such as ketones (for example, acetone, 2-butanone, methyl isobutyl ketone, cyclopentanone, and cyclohexanone), ethers (for example, dioxane, tetrahydrofuran, 2-methyltetrahydrofuran, cyclopentyl methyl ether, tetrahydropyran, and dioxolan), aliphatic hydrocarbons (for example, hexane), alicyclic hydrocarbons (for example, cyclohexane), aromatic hydrocarbons (for example, benzene, toluene, xylene, and trimethylbenzene), halogenated carbons (for example, dichloromethane, trichloromethane, dichloroethane, dichlorobenzene, and chlomtoluene), esters (for example, methyl acetate, ethyl acetate, butyl acetate, and ethyl lactate), alcohols (for example, ethanol, isopropanol, butanol, cyclohexanol, isopentyl alcohol, neopentyl alcohol, diacetone alcohol, and benzyl alcohol), cellosolves (for example, methyl cellosolve, ethyl cellosolve, and 1,2-dimethoxyethane), cellosolve acetates, sulfoxides (for example, dimethyl sulfoxide), amides (for example, dimethylformamide, dimethylacetamide, N-methylpyrrolidone, and N-ethylpyrrolidone), and heterocyclic compounds (for example, pyridine), and water. These solvents may be used alone or in combination of two or more kinds thereof.

Among these solvents, ketones (particularly, cyclopentanone and cyclohexanone), ethers (particularly, tetrahydrofuran, cyclopentyl methyl ether, tetrahydropyran, and dioxolan) and amides (particularly, dimethylformamide, dimethylacetamide, N-methylpyrrolidone, and N-ethylpyrrolidone) are preferable from the viewpoint of utilizing the effect that the solubility is excellent.

In a case where the liquid crystalline composition according to the embodiment of the invention contains a solvent, the content of the solvent is preferably 80 to 99 mass %, more preferably 83 to 98 mass %, and even more preferably 85 to 96 mass % with respect to the total mass of the liquid crystalline composition.

[Interface Improver]

The liquid crystalline composition according to the embodiment of the invention preferably contains an interface improver. Due to the interface improver contained, the smoothness of the coating surface is improved, and the alignment degree is improved or cissing and unevenness are suppressed. Thus, an improvement in the in-plane uniformity is anticipated.

As the interface improver, a material making the liquid crystal compound horizontal on the coating surface side is preferable, and the compounds (horizontal alignment agents) described in paragraphs [0253] to [0293] of JP2011-237513A can be used. The fluorine (meth)acrylate-based polymers described in paragraphs [0018] to [0043] of JP2007-272185A and the like can also be used. Other compounds may also be used as the interface improver.

In a case where the liquid crystalline composition according to the embodiment of the invention contains an interface improver, the content of the interface improver is preferably 0.001 to 5 parts by mass, and more preferably 0.01 to 3 parts by mass with respect to a total of 100 parts by mass of the dichroic substance and the polymer liquid crystal compound in the liquid crystalline composition.

[Light Absorption Anisotropic Film]

The light absorption anisotropic film according to the embodiment of the invention is formed using the above-described liquid crystalline composition according to the embodiment of the invention.

Examples of the method of manufacturing the light absorption anisotropic film according to the embodiment of the invention include a method including, in order, a step of forming a coating film by applying the liquid crystalline composition to a base (hereinafter, also referred to as "coating film forming step") and a step of aligning a dichroic substance contained in the coating film (hereinafter, also referred to as "alignment step").

Hereinafter, the respective steps of the method of manufacturing the light absorption anisotropic film according to the embodiment of the invention will be described.

[Coating Film Forming Step]

The coating film forming step is a step of forming a coating film by applying the liquid crystalline composition to a base.

By using a liquid crystalline composition containing the above-described solvent, or a liquid material such as a molten liquid obtained by heating the liquid crystalline composition, the liquid crystalline composition is easily applied to the base.

Examples of the method of applying the liquid crystalline composition include known methods such as a roll coating method, a gravure printing method, a spin coating method, a wire bar coating method, an extrusion coating method, a direct gravure coating method, a reverse gravure coating method, a die-coating method, a spray method, and an ink jet method.

In this aspect, an example has been given in which the liquid crystalline composition is applied to the base, but the invention is not limited thereto. For example, the liquid crystalline composition may be applied to an alignment film provided on the base. Details of the base and the alignment film will be described later.

[Alignment Step]

The alignment step is a step of aligning a dichroic substance contained in the coating film. Thus, a light absorption anisotropic film is obtained.

The alignment step may have a drying treatment. Through the drying treatment, a component such as a solvent can be removed from the coating film. The drying treatment may be performed by a method of leaving the coating film for a predetermined time at room temperature (for example, natural drying), or a heating and/or air blowing method.

Here, the dichroic substance contained in the liquid crystalline composition may be aligned by the above-described coating film forming step or drying treatment. For example, in an aspect in which the liquid crystalline composition is prepared as a coating liquid containing a solvent, the coating film is dried to remove the solvent from the coating film, and thus a coating film having light absorption anisotropy (that is, light absorption anisotropic film) is obtained.

The alignment step preferably has a heating treatment. Accordingly, the dichroic substance contained in the coating film can be aligned, and thus the coating film after the heating treatment can be preferably used as a light absorption anisotropic film.

The heating treatment is preferably performed at 10° C. to 250° C., and more preferably at 25° C. to 190° C. in view of manufacturing suitability or the like. The heating time is preferably 1 to 300 seconds, and more preferably 1 to 60 seconds.

The alignment step may have a cooling treatment to be performed after the heating treatment. The cooling treatment is a treatment for cooling the coating film after the heating to about room temperature (20° C. to 25° C.). Accordingly, the alignment of the dichroic substance contained in the coating film can be fixed. The cooling means is not particularly limited, and the cooling can be performed by a known method.

By the above steps, a light absorption anisotropic film can be obtained.

In this aspect, examples of the method of aligning the dichroic substance contained in the coating film include the drying treatment and the heating treatment, but are not limited thereto, and a known alignment treatment can be used.

[Other Steps]

The method of manufacturing a light absorption anisotropic film may have a step of curing the light absorption anisotropic film (hereinafter, also referred to as "curing step") after the alignment step.

For example, the curing step is performed by heating and/or light irradiation (exposure). Among these, light irradiation is preferably performed to conduct the curing step.

As the light source used for curing, various light sources can be used such as infrared rays, visible light, and ultraviolet rays, and ultraviolet rays are preferable. In the curing, ultraviolet rays may be applied during heating, or may be applied via a filter which transmits only a component with a specific wavelength.

In addition, the exposure may be performed under a nitrogen atmosphere. In a case where the light absorption anisotropic film is cured by radical polymerization, inhibition of the polymerization by oxygen is reduced, and thus the exposure is preferably performed under a nitrogen atmosphere.

The film thickness of the light absorption anisotropic film is preferably 0.1 to 5.0 µm, and more preferably 0.3 to 1.5 µm. Although depending on the concentration of the dichroic substance in the liquid crystalline composition, a light absorption anisotropic film having an excellent absorbance is obtained in a case where the film thickness is 0.1 µm or greater, and a light absorption anisotropic film having an excellent transmittance is obtained in a case where the film thickness is 5.0 µm or less.

[Laminate]

A laminate according to the embodiment of the invention has a base and the light absorption anisotropic film according to the embodiment of the invention formed on the base.

The laminate according to the embodiment of the invention may further have a $\lambda/4$ plate formed on the light absorption anisotropic film.

In addition, the laminate according to the embodiment of the invention may have an alignment film between the base and the light absorption anisotropic film.

The laminate according to the embodiment of the invention may further have a barrier layer between the light absorption anisotropic film and the $\lambda/4$ plate.

Hereinafter, the constituent layers of the laminate according to the embodiment of the invention will be described.

[Base]

The base can be selected in accordance with usage of the light absorption anisotropic film, and examples thereof include glass and a polymer film. The light transmittance of the base is preferably 80% or greater.

In a case where a polymer film is used as the base, an optically isotropic polymer film is preferably used. As specific examples and preferable aspects of the polymer, those described in a paragraph [0013] of JP2002-022942A can be applied. In addition, even a conventionally known polymer such as polycarbonate or polysulfone in which birefringence is likely to be developed can also be used by reducing the developability through molecular modification described in WO00/026705A.

[Light Absorption Anisotropic Film]

Since the light absorption anisotropic film is as described above, the description thereof will be omitted.

[$\lambda/4$ Plate]

The "$\lambda/4$ plate" is a plate having a $\lambda/4$ function, and is specifically, a plate having a function of converting linearly polarized light with a specific wavelength into circularly polarized light (or converting circularly polarized light into linearly polarized light).

For example, in an aspect in which the $\lambda/4$ plate has a single layer structure, specific examples of the plate include a retardation film in which an optically anisotropic layer having $\lambda/4$ function is provided on a stretched polymer film or a support. In an aspect in which the $\lambda/4$ plate has a multilayered structure, specific examples of the plate include a broadband λ/4 plate having a laminate of a λ/4 plate and a λ/2 plate.

The λ/4 plate and the light absorption anisotropic film may be provided in contact with each other, or another layer may be provided between the λ/4 plate and the light absorption anisotropic film. Examples of the layer include a pressure sensitive adhesive layer or an adhesive layer for securing adhesiveness and a barrier layer.

[Barrier Layer]

In a case where the laminate according to the embodiment of the invention has a barrier layer, the barrier layer is provided between the light absorption anisotropic film and the λ/4 plate. In a case where a layer other than the barrier layer (for example, a pressure sensitive adhesive layer or an adhesive layer) is provided between the light absorption anisotropic film and the λ/4 plate, the barrier layer can be provided between, for example, the light absorption anisotropic film and the above layer other than the barrier layer.

The barrier layer is also called a gas barrier layer (oxygen barrier layer), and has a function of protecting the light absorption anisotropic film from a gas such as oxygen in the atmosphere, moisture, or a compound contained in the adjacent layer.

Regarding the barrier layer, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A can be referred to.

[Alignment Film]

The laminate according to the embodiment of the invention may have an alignment film between the base and the light absorption anisotropic film.

As the alignment film, any layer may be used as long as it allows the dichroic substance contained in the liquid crystalline composition according to the embodiment of the invention to have a desired alignment state on the alignment film.

The alignment film can be provided by means of a rubbing treatment on the film surface with an organic compound (preferably a polymer), oblique vapor deposition of an inorganic compound, forming a layer having microgrooves, or accumulation of an organic compound (for example, ω-tricosanoic acid, dioctadecylmethylammonium chloride or methyl stearate) by the Langmure-Blogette method (LB film). Furthermore, there have been known alignment films having an aligning function imparted thereto by applying an electrical field, applying a magnetic field, or light irradiation. In the invention, among these, an alignment film formed by a rubbing treatment is preferable in view of easy control of a pretilt angle of the alignment film, and a photo-alignment film formed by light irradiation is also preferable in view of alignment uniformity.

<Rubbed Alignment Film>

The polymer material used for an alignment film formed by a rubbing treatment is described in many literatures, and many commercially available products are available. In the invention, polyvinyl alcohol or polyimide, or derivatives thereof can be preferably used. Regarding the alignment film, the description in the 24th line on page 43 to 8th line on page 49 in WO2001/088574A1 can be referred to. The thickness of the alignment film is preferably 0.01 to 10 μm, and more preferably 0.01 to 1 μm.

<Photo-Alignment Film>

The photo-alignment material used for an alignment film formed by light irradiation is described in many literatures.

In the invention, preferable examples thereof include azo compounds described in JP2006-285197A, JP2007-076839A, JP2007-138138A, JP2007-094071 A, JP2007-121721 A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo-alignment units described in JP2002-265541A and JP2002-317013A, photocrosslinkable silane derivatives described in JP4205195B and JP4205198B, and photocrosslinkable polyimides, polyamides, and esters described in JP2003-520878A, JP2004-529220A, and JP4162850B. Azo compounds, photocrosslinkable polyimides, polyamides, and esters are more preferable.

To a photo-alignment film formed from the above-described material, linearly polarized light or unpolarized light is applied to manufacture a photo-alignment film.

In this specification, the "linearly polarized light irradiation" and the "unpolarized light irradiation" are operations for causing a photoreaction to the photo-alignment material. The wavelength of the light used varies depending on the photo-alignment material used and is not particularly limited as long as the wavelength is a wavelength necessary for the photoreaction. The peak wavelength of the light used for light irradiation is preferably 200 nm to 700 nm, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury/xenon lamp, and a carbon arc lamp, various lasers [for example, a semiconductor laser, a helium/neon laser, an argon ion laser, a helium/cadmium laser, and an YAG (yttrium/aluminum/garnet) laser], light emitting diodes, and cathode ray tubes.

As means for obtaining linearly polarized light, a method using a polarizing plate (for example, an iodine polarizing plate, a dichroic dye polarizing plate, or a wire grid polarizing plate), a method using a prism-based element (for example, a GLAN-THOMSON prism) or a reflective polarizer using a BREWSTER angle, or a method using light emitted from a polarized laser light source can be employed. Only light having a necessary wavelength may be selectively applied by using a filter, a wavelength conversion element, or the like.

In a case where linearly polarized light is used as light for irradiation, a method of irradiating the alignment film with light from an upper surface or a rear surface in a direction vertical or oblique to the alignment film surface is employed. Although the incidence angle of the light varies depending on the photo-alignment material, the incidence angle is preferably 0° to 90° (vertical), and more preferably 40° to 90°.

In a case where unpolarized light is used, the alignment film is irradiated with unpolarized light from an oblique direction. The incidence angle of the light is preferably 10° to 80°, more preferably 20° to 60°, and even more preferably 30° to 50°.

The irradiation time is preferably 1 minute to 60 minutes, and more preferably 1 minute to 10 minutes.

In a case where patterning is required, a method of performing light irradiation using a photomask as many times as necessary for pattern formation, or a pattern writing method using laser beam scanning can be employed.

[Usage]

The laminate according to the embodiment of the invention can be used as a polarizing element (polarizing plate). For example, it can be used as a linearly polarizing plate or a circularly polarizing plate.

In a case where the laminate according to the embodiment of the invention has no optically anisotropic layer such as the λ/4 plate, the laminate can be used as a linearly polarizing plate.

In a case where the laminate according to the embodiment of the invention has the λ/4 plate, the laminate can be used as a circularly polarizing plate.

[Image Display Device]

An image display device according to the embodiment of the invention has the above-described light absorption anisotropic film or the above-described laminate.

The display element used for the image display device according to the embodiment of the invention is not particularly limited, and examples thereof include a liquid crystal cell, an organic electroluminescence (hereinafter, abbreviated as "EL"), a display panel, and a plasma display panel.

Among these, a liquid crystal cell or an organic EL display panel is preferable, and a liquid crystal cell is more preferable. That is, as the image display device according to the embodiment of the invention, a liquid crystal display device using a liquid crystal cell as a display element, or an organic EL display device using an organic EL display panel as a display element is preferable, and a liquid crystal display device is more preferable.

[Liquid Crystal Display Device]

A liquid crystal display device as an example of the image display device according to the embodiment of the invention preferably has an aspect in which it has the above-described light absorption anisotropic film and a liquid crystal cell. More preferably, the liquid crystal display device has the above-described laminate (but including no λ/4 plate) and a liquid crystal cell.

In the invention, it is preferable that the light absorption anisotropic film (laminate) according to the embodiment of the invention be used as a polarizing element on the front side among light absorption anisotropic films (laminates) to be provided on both sides of a liquid crystal cell, and it is more preferable that the light absorption anisotropic film (laminate) according to the embodiment of the invention be used as polarizing elements on the front side and the rear side.

Hereinafter, the liquid crystal cell of the liquid crystal display device will be described in detail.

<Liquid Crystal Cell>

The liquid crystal cell used for the liquid crystal display device is preferably a vertical alignment (VA) mode, an optically compensated bend (OCB) mode, an in-plane-switching (IPS) mode, or a twisted nematic (TN) mode, but is not limited thereto.

In a TN mode liquid crystal cell, with no application of a voltage, rod-like liquid crystalline molecules are substantially horizontally aligned, and twist-aligned by 60° to 120°. The TN mode liquid crystal cell is most frequently used as a color thin film transistor (TFT) liquid crystal display device, and is described in many literatures.

In a VA mode liquid crystal cell, rod-like liquid crystalline molecules are substantially vertically aligned with no application of a voltage. The VA mode liquid crystal cell includes (1) a narrowly-defined VA mode liquid crystal cell in which rod-like liquid crystalline molecules are substantially vertically aligned with no application of a voltage, and are substantially horizontally aligned with the application of a voltage (described in JP1990-176625A (JP-H2-176625A)), (2) a (MVA mode) liquid crystal cell in which the VA mode is made into multi-domains in order to expand the viewing angle (described in SID97, Digest of tech. Papers (proceedings) 28 (1997) 845), (3) an (n-ASM mode) liquid crystal cell in which rod-like liquid crystalline molecules are substantially vertically aligned with no application of a voltage, and are twisted in multi-domains with the application of a voltage (described in the proceedings 58 and 59 of Japanese Liquid Crystal Conference (1998)), and (4) a SURVIVAL mode liquid crystal cell (announced at LCD internal 98). In addition, the VA mode liquid crystal cell may be any one of a patterned vertical alignment (PVA) type, an optical alignment type, or a polymer-sustained alignment (PSA) type. Details of these modes are described in JP2006-215326A and JP2008-538819A.

In an IPS mode liquid crystal cell, rod-like liquid crystalline molecules are substantially horizontally aligned with respect to a substrate, and the liquid crystalline molecules respond in a planar manner with the application of an electric field parallel to a substrate surface. The IPS mode displays a black image in a state in which no electric field is applied thereto, and the absorption axes of a pair of upper and lower polarizing plates are perpendicular to each other. A method of improving the viewing angle by reducing light leakage caused when a black image is displayed in an oblique direction using an optical compensation sheet is disclosed by JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), JP1998-307291 A (JP-H10-307291A), and the like.

[Organic EL Display Device]

An organic EL display device as an example of the image display device according to the embodiment of the invention preferably has an aspect in which it has a light absorption anisotropic film, a λ/4 plate, and an organic EL display panel in this order from the visual recognition side.

More preferably, the organic EL display device has the above-described laminate having a λ/4 plate and an organic EL display panel in this order from the visual recognition side. In this case, the laminate has a base, an alignment film to be provided as necessary, a light absorption anisotropic film, a barrier layer to be provided as necessary, and a λ/4 plate disposed in this order from the visual recognition side.

In addition, the organic EL display panel is a display panel configured using an organic EL element in which an organic light emitting layer (organic electroluminescence layer) is interposed between electrodes (between a cathode and an anode). The configuration of the organic EL display panel is not particularly limited, and a known configuration is employed.

EXAMPLES

Hereinafter, the invention will be more specifically described based on examples. Materials, used amounts, ratios, treatment contents, treatment procedures, and the like shown in the following examples are able to be properly changed without departing from the gist of the invention. Therefore, the scope of the invention will not be restrictively interpreted by the following examples.

Synthesis Example 1

[Synthesis of Polymer Liquid Crystal Compound P1]

A polymer liquid crystal compound P1 was produced according to the following procedures.

<Synthesis of P1-1>

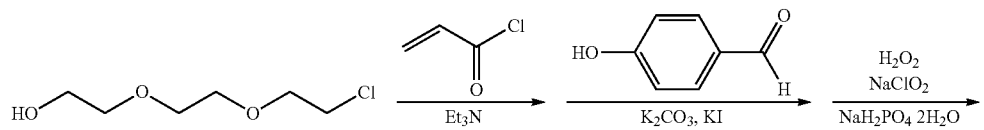

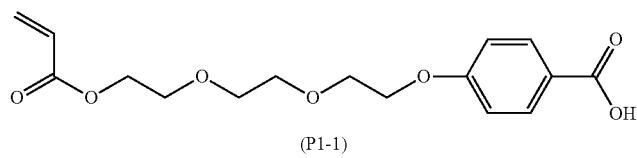

(P1-1)

Dibutylhydroxytoluene (BHT) (100 mg) was added to a dimethylacetamide (DMAc) solution (60 mL) of 2-chloroethoxyethoxyethanol (14.05 g), and acrylic acid chloride (7.54 g) and triethylamine (8.89 g) were added dropwise under ice cooling. After stirring for 1 hour, the reaction liquid was filtered. Next, potassium carbonate (15.7 g), potassium iodide (0.57 g), p-hydroxybenzaldehyde (9.25 g), and dibutylhydroxytoluene (BHT) (100 mg) were added. After stirring at 110° C. for 4 hours, ethyl acetate and water were added to wash the reaction liquid by a liquid separating operation. The reaction liquid was concentrated by an evaporator. Then, the temperature was returned to room temperature, and 25 mL of acetonitrile, a phosphate buffer obtained by dissolving 2.36 g of sodium dihydrogen phosphate dihydrate in 8 mL of water, and 11.2 mL of hydrogen peroxide water (30 mass %) were added. Next, 33.4 g of a 25 mass % aqueous sodium chlorite solution was added. After stirring for 6 hours at room temperature and leaving for 8 hours, water was added, and the obtained precipitates were collected to obtain 16.9 g of a compound (P1-1) (yield: 69%) as a white solid.

<Synthesis of P1-2>

Dibutylhydroxytoluene (BHT) (200 mg) was added to a tetrahydrofuran (THF) solution (70 mL) of methanesulfonyl chloride (MsCl) (73.4 mmol, 5.7 mL) and cooled to an internal temperature of −5° C. The compound (P1-1) (66.7 mmol, 21.6 g) and a THF solution of diisopropylethylamine (DIPEA) (75.6 mmol, 13.0 mL) were added dropwise thereto such that the internal temperature did not increase to 0° C. or higher. After stirring for 30 minutes at −5° C., N,N-dimethyl-4-aminopyridine (DMAP) (200 mg) was added, and diisopropylethylamine (75.6 mmol, 13.0 mL), tetrahydrofuran (THF) of 4-hydroxy-4'-methoxybiphenyl (60.6 mmol, 12.1 g), and a dimethylacetamide (DMAc) solution were added dropwise such that the internal temperature did not increase to 0° C. or higher. Then, stirring was performed for 4 hours at room temperature. The reaction was stopped by adding methanol (5 mL), and then water and ethyl acetate were added. The solvent was removed from the organic layer extracted with the ethyl acetate by a rotary evaporator, and purification by column chromatography using ethyl acetate and hexane was performed to obtain 18.7 g of a compound (P1-2) (yield: 61%) as a white solid.

$^1$H-NMR (solvent: CDCl$_3$) δ (ppm): 3.65 to 3.82 (m, 6H), 3.85 (s, 3H), 3.85 to 3.95 (m, 2H), 4.18 to 4.28 (m, 2H), 4.28 to 4.40 (m, 2H), 5.82 (dd, 1H), 6.15 (dd, 1H), 6.43 (dd, 1H), 6.90 to 7.05 (m, 4H), 7.20 to 7.30 (m, 2H), 7.45 to 7.65 (m, 4H), 8.10 to 8.20 (m, 2H)

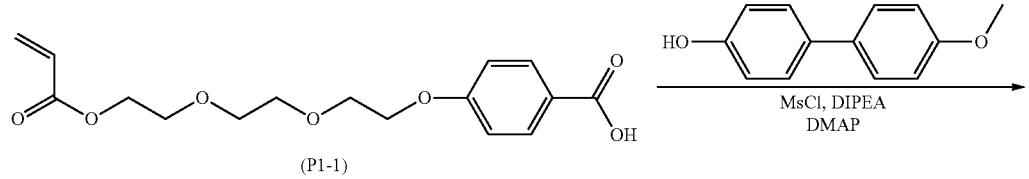

(P1-1)

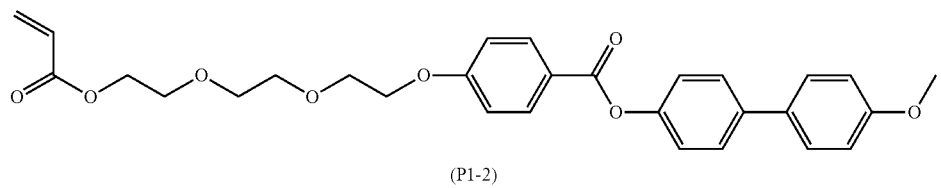

(P1-2)

<Synthesis of P1>

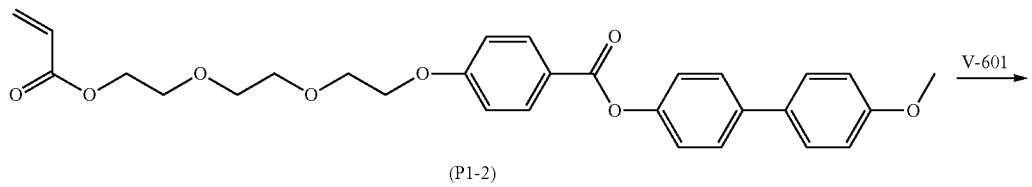

(P1-2)

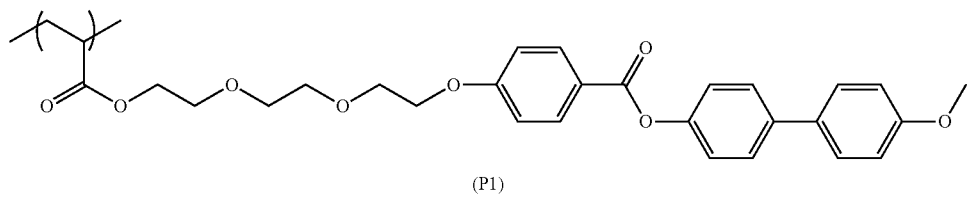

(P1)

A DMAc solution (3.3 mL) of the compound (P1-2) (1.0 g) was heated to an internal temperature of 80° C. under a nitrogen stream. A DMAc solution (0.5 mL) of 2,2'-azobis (2-methylpropionic acid)dimethyl (0.054 mmol, 0.012 g) (trade name "V-601", manufactured by FUJIFILM Wako Pure Chemical Corporation) was added thereto, and stirring was performed for 2 hours at 80° C. Thereafter, disappearance of the polymerizable group was confirmed by $^1$H-NMR spectrum measurement, and the solution was cooled to room temperature. Methanol was added for filtering, and the residues were washed with methanol to obtain 0.95 g of a compound (P1) as a white solid. A weight-average molecular weight (Mw) of the obtained polymer was 10,000.

The molecular weight was calculated in terms of polystyrene by gel permeation chromatography (GPC) with the use of TSKgel SuperHZM-H, TSKgel SuperHZ4000, and TSKgel SuperHZ2000 (manufactured by Tosoh Corporation) as columns and N-methylpyrrolidone as a solvent.

Synthesis Example 2

[Synthesis of Polymer Liquid Crystal Compound P9]

A polymer liquid crystal compound P9 was synthesized according to the following steps 1 to 3.

<Step 1>

Sodium hydroxide (34.2 g) was dissolved in 1 L of water, and 4,4'-dihydroxybiphenyl (40.6 g) and bromoethanol (37.2 g) were added under a nitrogen atmosphere. The mixture was stirred for 10 hours at 95° C.

Then, the reaction system was cooled to room temperature and adjusted to be acidic by adding a concentrated hydrochloric acid. After that, filtering and drying were performed to obtain a white solid containing a compound P9-A.

The obtained white solid was dissolved in 400 mL of dimethylacetamide (DMAc), and 3-chloropropionyl chloride (62.0 g) was added dropwise under ice cooling. Stirring was performed for 5 hours. The reaction was stopped by adding methanol (40 mL), and then water and ethyl acetate were added.

The solvent was removed from the organic layer washed by a liquid separating operation by a rotary evaporator, and chloroform was added to the obtained concentrate. After the precipitated solid was removed by filtering, the solvent was removed by a rotary evaporator, and purification was performed by column chromatography using ethyl acetate/chloroform to obtain 20.3 g of a compound P9-A (yield: 29%) as a white solid.

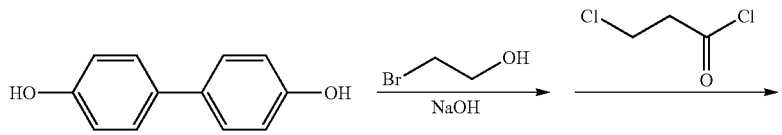

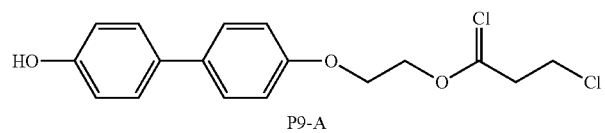

P9-A

¹H-NMR (solvent: DMSO-d₆) δ (ppm): 2.80 to 2.90 (t, 2H), 3.75 to 3.85 (t, 2H), 4.15 to 4.25 (m, 2H), 4.35 to 4.45 (m, 2H), 6.75 to 6.85 (m, 2H), 6.90 to 7.00 (m, 2H), 7.30 to 7.50 (m, 4H), 9.40 (br.s, 1H)

<Step 2> methanol and 120 mL of a 1 M hydrochloric acid solution to obtain a white solid. Liquid separation was performed by adding ethyl acetate and water to the obtained white solid, and the collected organic layer was washed with a 1 N hydrochloric acid solution and saturated saline. Then, drying performed with anhydrous sodium sulfate. The sodium

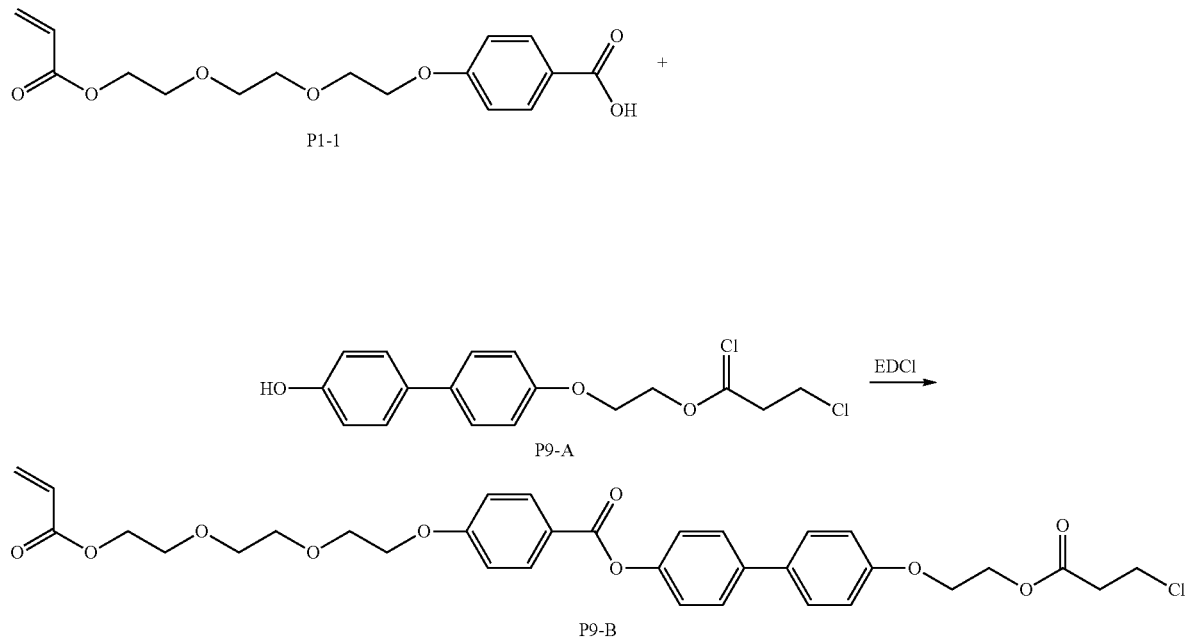

4.0 g of the compound P9-A, 8.08 g of the compound P1-1 prepared in Synthesis Example 1, and 100 mL of dichloromethane were mixed and stirred at room temperature. To the mixture, 152 mg of N,N-dimethylaminopyridine and 9.56 g of 1-(3-dimethylaminopropyl)-3-ethylcarbodiimide hydrochloride (EDCI) were added and stirred for 12 hours at room temperature.

Thereafter, the solvent was removed by a rotary evaporator, and filtering was performed by adding 120 mL of was sulfate was filtered off to remove the solvent by a rotary evaporator, and purification by silica gel chromatography was performed to obtain 5.4 g of a compound P9-B (yield: 69%).

¹H-NMR (solvent: CDCl₃) δ (ppm): 2.87 (t, 2H), 3.68 to 3.82 (m, 8H), 3.90 (t, 2H), 4.18 to 4.28 (m, 4H), 4.28 to 4.38 (m, 2H), 4.46 to 4.54 (m, 2H), 5.84 (dd, 1H), 6.16 (dd, 1H), 6.43 (dd, 1H), 6.90 to 7.05 (m, 4H), 7.20 to 7.30 (m, 2H), 7.48 to 7.65 (m, 4H), 8.10 to 8.20 (m, 2H)

<Step 3>

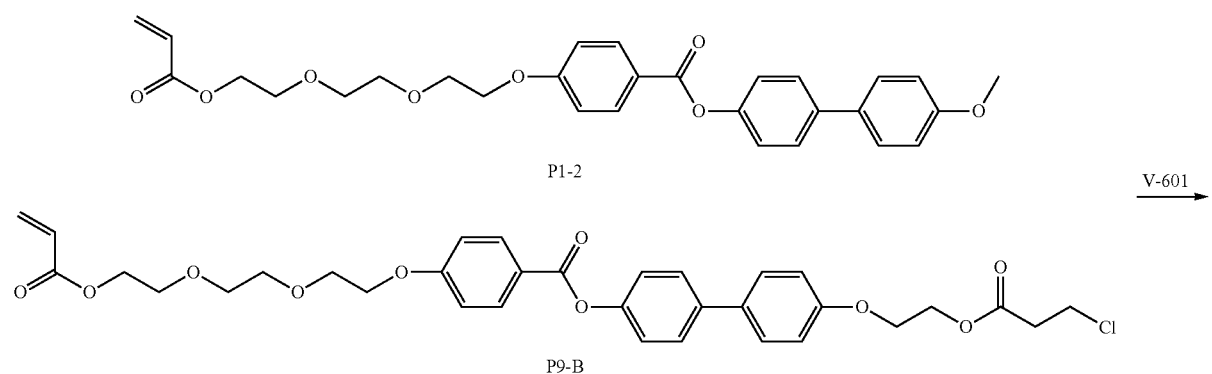

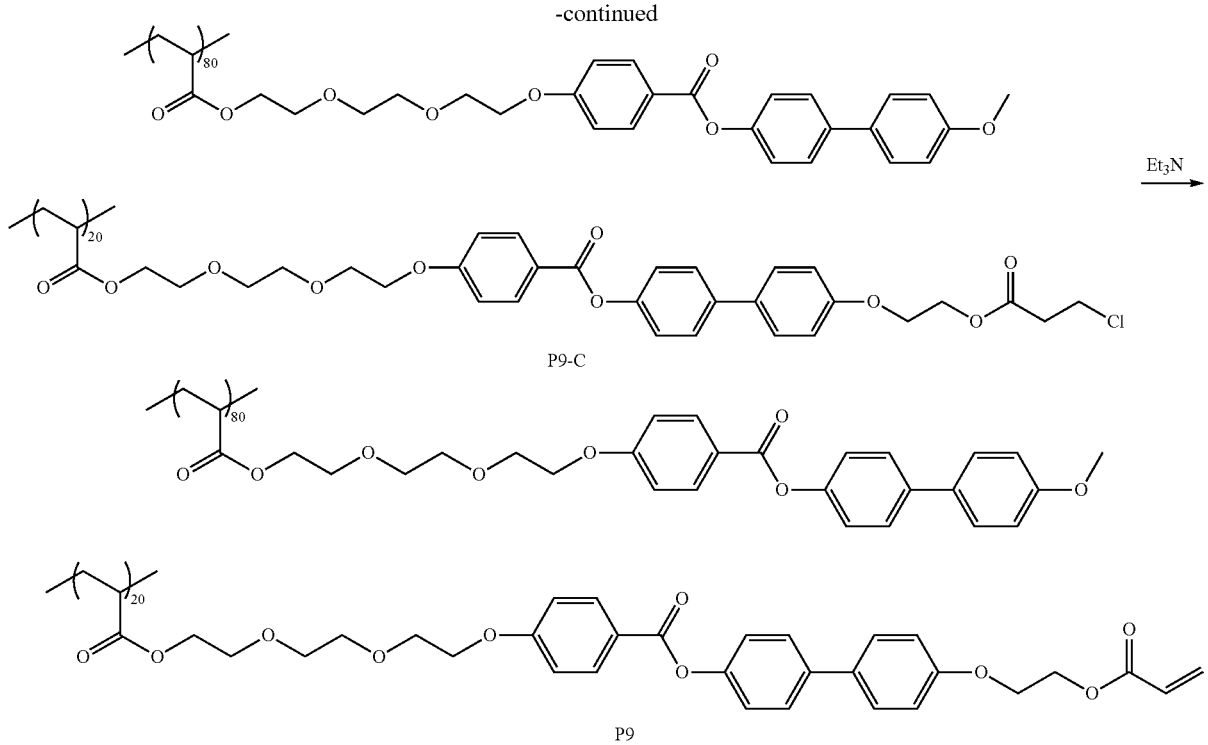

A DMAc solution (3.3 mL) of the compound P1-2 (0.8 g) and the compound P9-B (0.2 g) was heated to an internal temperature of 80° C. under a nitrogen stream. A DMAc solution (0.5 mL) of 2,2'-azobis(2-methylpropionic acid) dimethyl (0.054 mmol, 0.012 g) was added thereto, and stirring was performed for 2 hours at 80° C. Thereafter, disappearance of the polymerizable group was confirmed by $^1$H-NMR spectrum measurement, and the solution was cooled to room temperature. Methanol was added for filtering, and the residues were washed with methanol to obtain 0.90 g of a compound P9-C as a white solid. Dibutylhydroxytoluene (BHT) (50 mg) and triethylamine (0.7 mL) were added to a chloroform solution (7 mL) of the obtained compound P9-C and heated to an internal temperature of 50° C. After stirring for 9 hours at 50° C., disappearance of the raw material was confirmed by $^1$H-NMR spectrum measurement, and the solution was cooled to room temperature. Methanol was added thereto for filtering, and the residues were washed with methanol to obtain 0.8 g of a polymer liquid crystal compound P9 as a white solid. In a case where the obtained polymer liquid crystal compound P9 was analyzed by gel permeation chromatography (GPC), a weight-average molecular weight (Mw) was 17,000 (in terms of polystyrene).

[Polymer Liquid Crystal Compounds P2 to P8, P10, and P11]

Polymer liquid crystal compounds P2 to P8, P10, and P11 were synthesized in the same manner as in the case of the polymer liquid crystal compound P1 or P9 or according to a known method.

[Synthesis of Polymer Liquid Crystal Compound P12]

A polymer liquid crystal compound P12 was synthesized according to the following steps 1 and 2.

<Step 1>

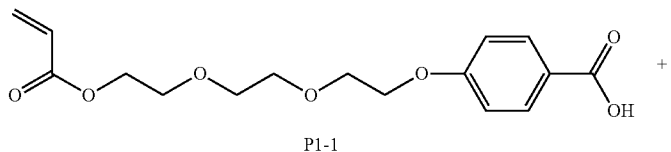

P1-1

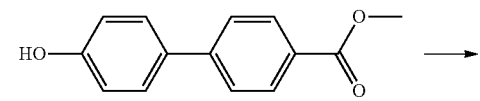

-continued

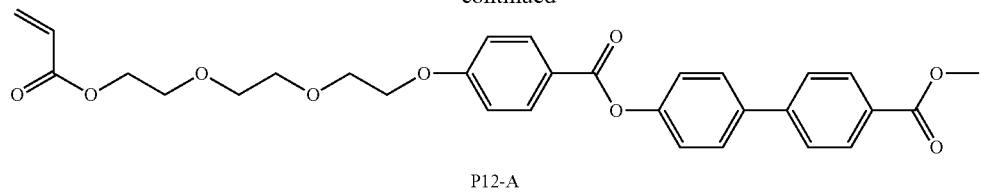

P12-A

Methyl 4-(4-hydroxyphenyl)benzoate was synthesized by the method described in Journal of Polymer Science, Part A: Polymer Chemistry, 2012, vol. 50, p. 3936 to 3943.

2,2,6,6-tetramethylpiperidine1-oxyl (68 mg) was added to an ethyl acetate solution (44 mL) of methanesulfonyl chloride (MsCl) (54.8 mmol, 6.27 g) and cooled to an internal temperature of −5° C. The compound (P1-1) (52.6 mmol, 17.1 g) and a THF solution of diisopropylethylamine (DIPEA) (57.0 mol, 7.36 g) were added dropwise thereto such that the internal temperature did not increase to 0° C. or higher. After stirring for 30 minutes at −5° C., a DMAc solution of methyl 4-(4-hydroxyphenyl)benzoate (43.8 mmol, 10.0 g) and N-methyl-imidazole (NMI) (1.8 g) were added, and diisopropylethylamine (75.6 mmol, 13.0 mL) was added dropwise such that the internal temperature did not increase to 0° C. or higher. Then, stirring was performed for 4 hours at room temperature. The reaction was stopped by adding water and ethyl acetate. Liquid separation was performed, and the solvent was removed from the organic layer extracted with the ethyl acetate by a rotary evaporator. Purification by column chromatography using ethyl acetate and hexane was performed to obtain 20.4 g of a compound (P12-A) (yield: 87%) as a white solid.

$^1$H-NMR (solvent: CDCl$_3$) δ (ppm): 3.68 to 3.80 (m, 6H), 3.87 to 3.95 (m, 2H), 3.95 (s, 3H), 4.20 to 4.27 (m, 2H), 4.31 to 4.37 (m, 2H), 5.83 (dd, 1H), 6.16 (dd, 1H), 6.43 (dd, 1H), 6.97 to 7.05 (m, 2H), 7.28 to 7.35 (m, 2H), 7.64 to 7.72 (m, 4H), 8.08 to 8.20 (m, 4H)

<Step 2>

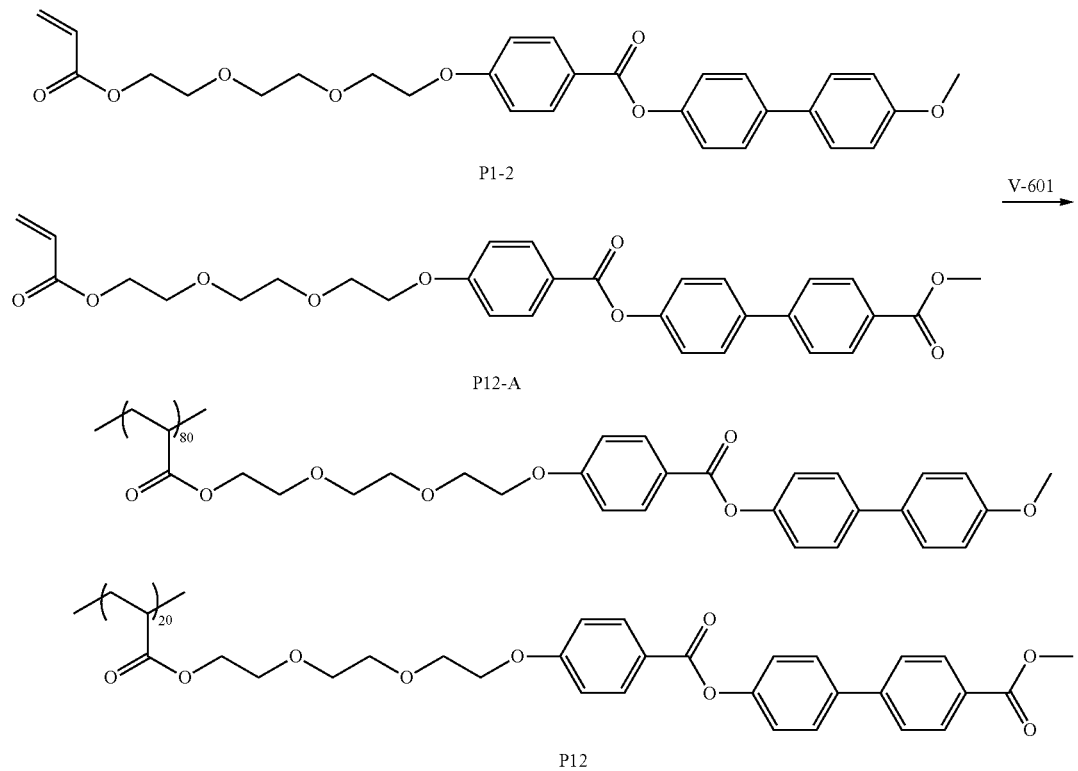

A DMAc solution (3.3 mL) of the compound (P1-2) (0.8 g) and the compound P12-A (0.2 g) was heated to an internal temperature of 80° C. under a nitrogen stream. A DMAc solution (0.5 mL) of 2,2'-azobis(2-methylpropionic acid) dimethyl (0.054 mmol, 0.012 g) (trade name "V-601", manufactured by FUJIFILM Wako Pure Chemical Corporation) was added thereto, and stirring was performed for 2 hours at 80° C. Thereafter, disappearance of the polymerizable group was confirmed by $^1$H-NMR spectrum measurement, and the solution was cooled to room temperature. Methanol was added for filtering, and the residues were washed with methanol to obtain 0.95 g of a compound (P12) as a white solid. In a case where the obtained polymer liquid crystal compound P12 was analyzed by gel permeation chromatography (GPC), a weight-average molecular weight (Mw) thereof was 15,000 (in terms of polystyrene).

[Synthesis of Polymer Liquid Crystal Compound P13]

A polymer liquid crystal compound P13 was synthesized according to the following steps 1 and 2.

<Step 1>

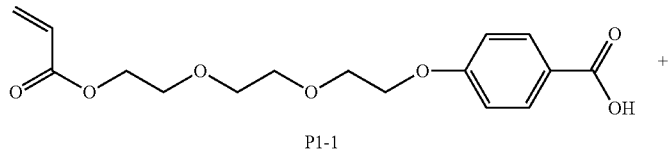

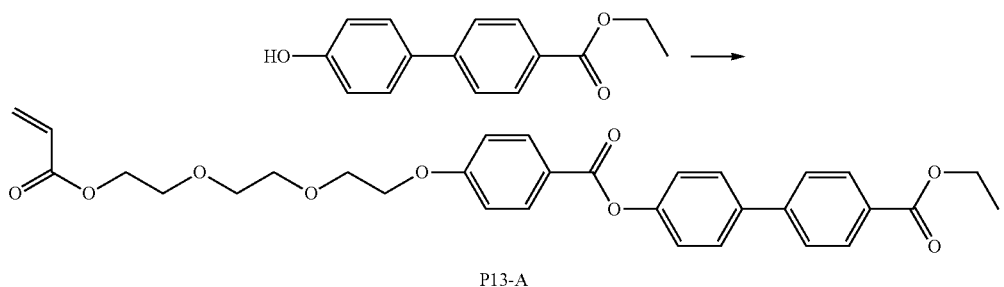

Ethyl 4-(4-hydroxyphenyl)benzoate was synthesized by the method described in Macromolecules, 2002, 35, 1663 to 1671.

2,2,6,6-tetramethylpiperidine1-oxyl (68 mg) was added to an ethyl acetate solution (44 mL) of methanesulfonyl chloride (MsCl) (54.8 mmol, 6.27 g) and cooled to an internal temperature of −5° C. The compound (P1-1) (52.6 mmol, 17.1 g) and a THF solution of diisopropylethylamine (DIPEA) (57.0 mol, 7.36 g) were added dropwise thereto such that the internal temperature did not increase to 0° C. or higher. After stirring for 30 minutes at −5° C., a DMAc solution of ethyl 4-(4-hydroxyphenyl)benzoate (43.8 mmol, 10.6 g) and N-methyl-imidazole (NMI) (1.8 g) were added, and diisopropylethylamine (75.6 mmol, 13.0 mL) was added dropwise such that the internal temperature did not increase to 0° C. or higher. Then, stirring was performed for 4 hours at room temperature. The reaction was stopped by adding water and ethyl acetate. Liquid separation was performed, and the solvent was removed from the organic layer extracted with the ethyl acetate by a rotary evaporator. Purification by column chromatography using ethyl acetate and hexane was performed to obtain 20.6 g of a compound (P13-A) (yield: 86%) as a white solid.

$^1$H-NMR (solvent: CDCl$_3$) δ (ppm): 1.41 (t, 3H), 3.68 to 3.80 (m, 6H), 3.88 to 3.95 (m, 2H), 4.20 to 4.27 (m, 2H), 4.31 to 4.38 (m, 2H), 4.41 (q, 2H), 5.83 (dd, 1H), 6.16 (dd, 1H), 6.43 (dd, 1H), 6.97 to 7.05 (m, 2H), 7.28 to 7.35 (m, 2H), 7.64 to 7.72 (m, 4H), 8.08 to 8.20 (m, 4H)

<Step 2>

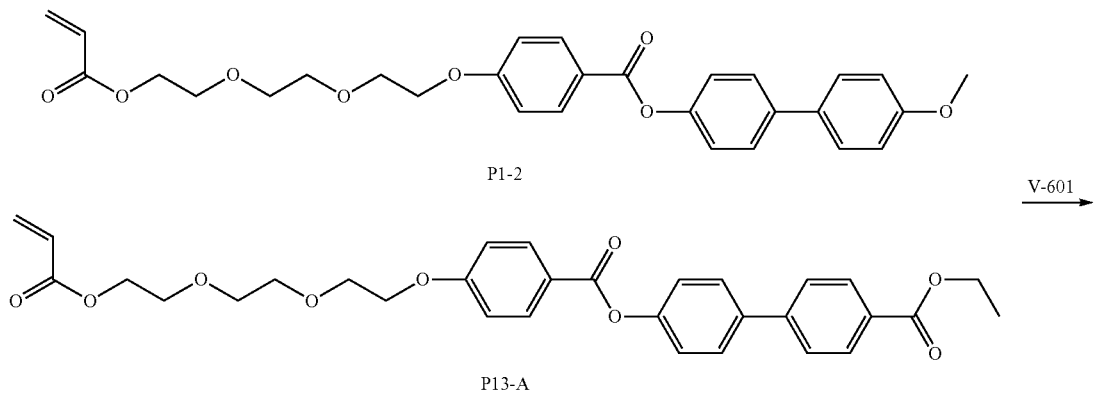

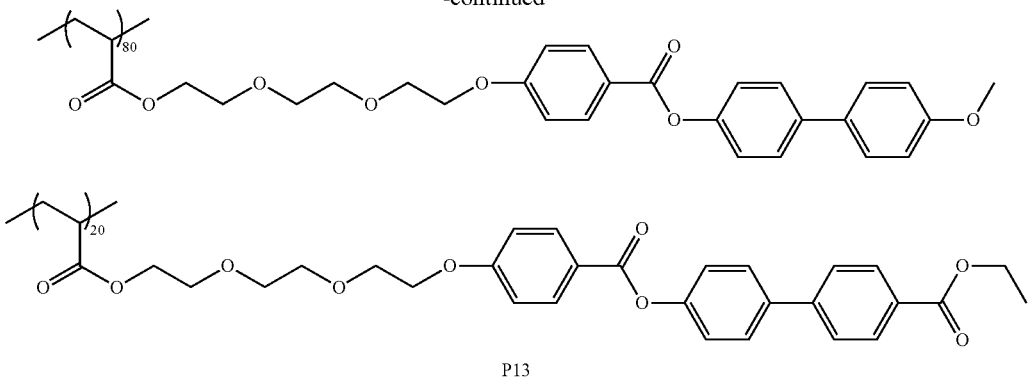

P13

A DMAc solution (3.3 mL) of the compound (P1-2) (0.8 g) and the compound P13-A (0.2 g) was heated to an internal temperature of 80° C. under a nitrogen stream. A DMAc solution (0.5 mL) of 2,2'-azobis(2-methylpropionic acid) dimethyl (0.054 mmol, 0.012 g) (trade name "V-601", manufactured by FUJIFILM Wako Pure Chemical Corporation) was added thereto, and stirring was performed for 2 hours at 80° C. Thereafter, disappearance of the polymerizable group was confirmed by $^1$H-NMR spectrum measurement, and the solution was cooled to room temperature. Methanol was added for filtering, and the residues were washed with methanol to obtain 0.96 g of a compound (P13) as a white solid. In a case where the obtained polymer liquid crystal compound P13 was analyzed by gel permeation chromatography (GPC), a weight-average molecular weight (Mw) thereof was 16,000 (in terms of polystyrene).

[Synthesis of Polymer Liquid Crystal Compound P14]

A polymer liquid crystal compound P14 was synthesized according to the following steps 1 and 2.

<Step 1>

2,2,6,6-tetramethylpiperidine1-oxyl (68 mg) was added to an ethyl acetate solution (44 mL) of methanesulfonyl chloride (MsCl) (54.8 mmol, 6.27 g) and cooled to an internal temperature of −5° C. The compound (P1-1) (52.6 mmol, 17.1 g) and a THF solution of diisopropylethylamine (DIPEA) (57.0 mol, 7.36 g) were added dropwise thereto such that the internal temperature did not increase to 0° C. or higher. After stirring for 30 minutes at −5° C., a DMAc solution of 4-cyano-4'-hydroxybiphenyl (43.8 mmol, 8.55 g) and N-methyl-imidazole (NMI) (1.8 g) were added, and diisopropylethylamine (75.6 mmol, 13.0 mL) was added dropwise such that the internal temperature did not increase to 0° C. or higher. Then, stirring was performed for 4 hours at room temperature. The reaction was stopped by adding water and ethyl acetate. Liquid separation was performed, and the solvent was removed from the organic layer extracted with the ethyl acetate by a rotary evaporator. Purification by column chromatography using ethyl acetate and hexane was performed to obtain 19.0 g of a compound (P14-A) (yield: 87%) as a white solid.

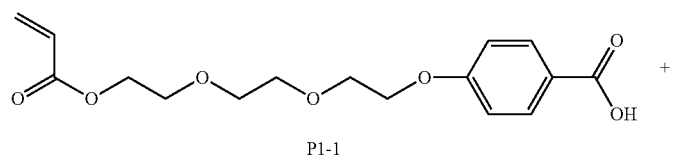

P1-1

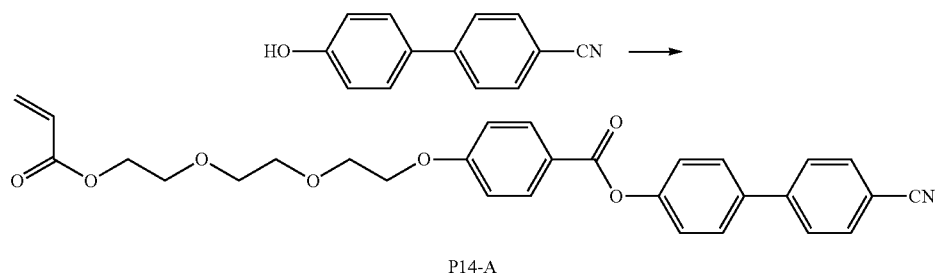

P14-A

¹H-NMR (solvent: CDCl₃) δ (ppm): 3.68 to 3.80 (m, 6H), 3.87 to 3.95 (m, 2H), 4.20 to 4.27 (m, 2H), 4.32 to 4.37 (m, 2H), 5.84 (dd, 1H), 6.16 (dd, 1H), 6.43 (dd, 1H), 6.98 to 7.05 (m, 2H), 7.30 to 7.37 (m, 2H), 7.60 to 7.78 (m, 6H), 8.13 to 8.20 (m, 2H)

<Step 2>

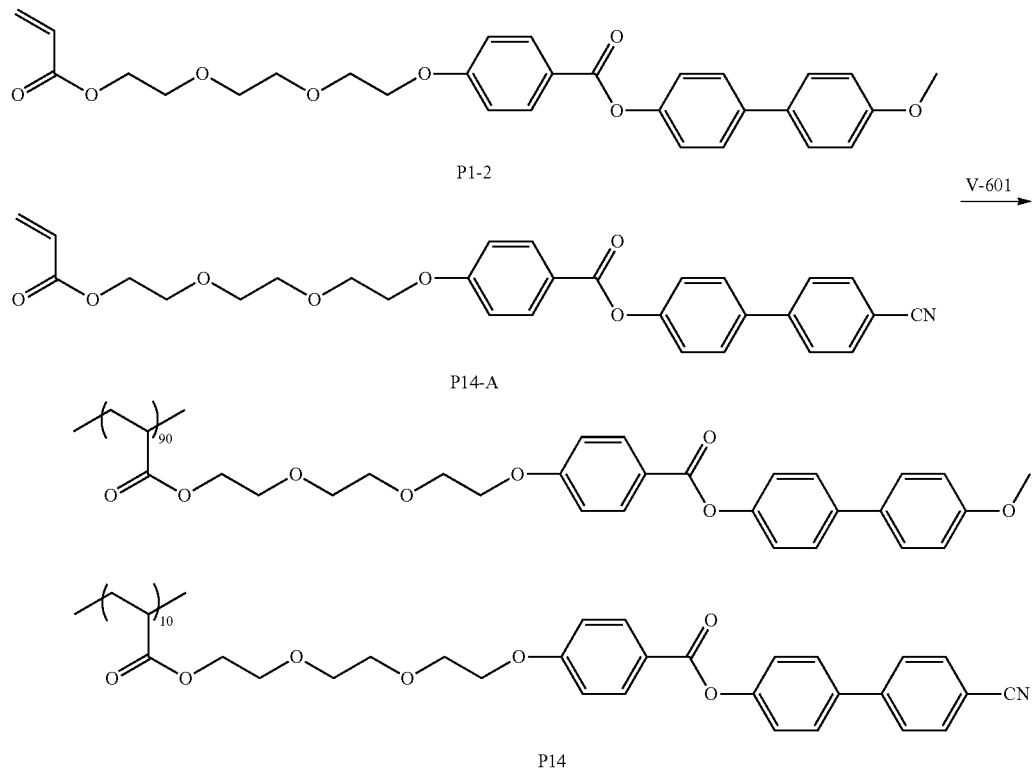

A DMAc solution (3.3 mL) of the compound (P1-2) (0.9 g) and the compound P14-A (0.1 g) was heated to an internal temperature of 80° C. under a nitrogen stream. A DMAc solution (0.5 mL) of 2,2'-azobis(2-methylpropionic acid) dimethyl (0.054 mmol, 0.012 g) (trade name "V-601", manufactured by FUJIFILM Wako Pure Chemical Corporation) was added thereto, and stirring was performed for 2 hours at 80° C. Thereafter, disappearance of the polymerizable group was confirmed by ¹H-NMR spectrum measurement, and the solution was cooled to room temperature. Methanol was added for filtering, and the residues were washed with methanol to obtain 0.96 g of a compound (P14) as a white solid. In a case where the obtained polymer liquid crystal compound P14 was analyzed by gel permeation chromatography (GPC), a weight-average molecular weight (Mw) thereof was 14,000 (in terms of polystyrene).

In the following description, the difference between a log $P_1$ value from a main chain to a spacer group and a log P2 value of a mesogenic group is shown together with the structures of the polymer liquid crystal compounds P1 to P14.

| | Structure | logP₁ from Main Chain to Spacer Group | logP₂ of Mesogenic Group | logP Difference [logP₁-logP₂] |
|---|---|---|---|---|
| P1 | | −0.31 | 4.09 | 4.4 |

-continued

| | Structure | logP₁ from Main Chain to Spacer Group | logP₂ of Mesogenic Group | logP Difference [logP₁-logP₂] |
|---|---|---|---|---|
| P2 | | −0.61 | 4.09 | 4.7 |
| P3 | | −0.03 | 4.09 | 4.12 |
| P4 | | −0.31 | 5.11 | 5.42 |
| P5 | | 4.53 | 5.11 | 0.58 |
| P6 | | 1.69 | 4.09 | 2.4 |
| P7 | | −0.31 | 4.09 | 4.4 |
| | | −0.31 | 4.09 | 4.4 |
| P8 | | −0.31 | 4.09 | 4.4 |
| | | −0.31 | 4.01 | 4.32 |
| P9 | | −0.31 | 4.09 | 4.4 |

-continued

| Structure | logP$_1$ from Main Chain to Spacer Group | logP$_2$ of Mesogenic Group | logP Difference [logP$_1$ - logP$_2$] |
|---|---|---|---|
| (structure) | −0.31 | 4.09 | 4.4 |
| P10 (structure) | −0.61 | 4.09 | 4.7 |
| (structure) | — | — | — |
| P11 (structure) | −0.31 | 4.09 | 4.4 |
| (structure) | 2.58 | 5.11 | 2.53 |
| P12 (structure) | −0.31 | 4.09 | 4.4 |
| (structure) | −0.31 | 4.09 | 4.4 |
| P13 (structure) | −0.31 | 4.09 | 4.4 |
| (structure) | −0.31 | 4.09 | 4.4 |
| P14 (structure) | −0.31 | 4.09 | 4.4 |

| Structure | logP₁ from Main Chain to Spacer Group | logP₂ of Mesogenic Group | logP Difference [logP₁-logP₂] |
|---|---|---|---|
| 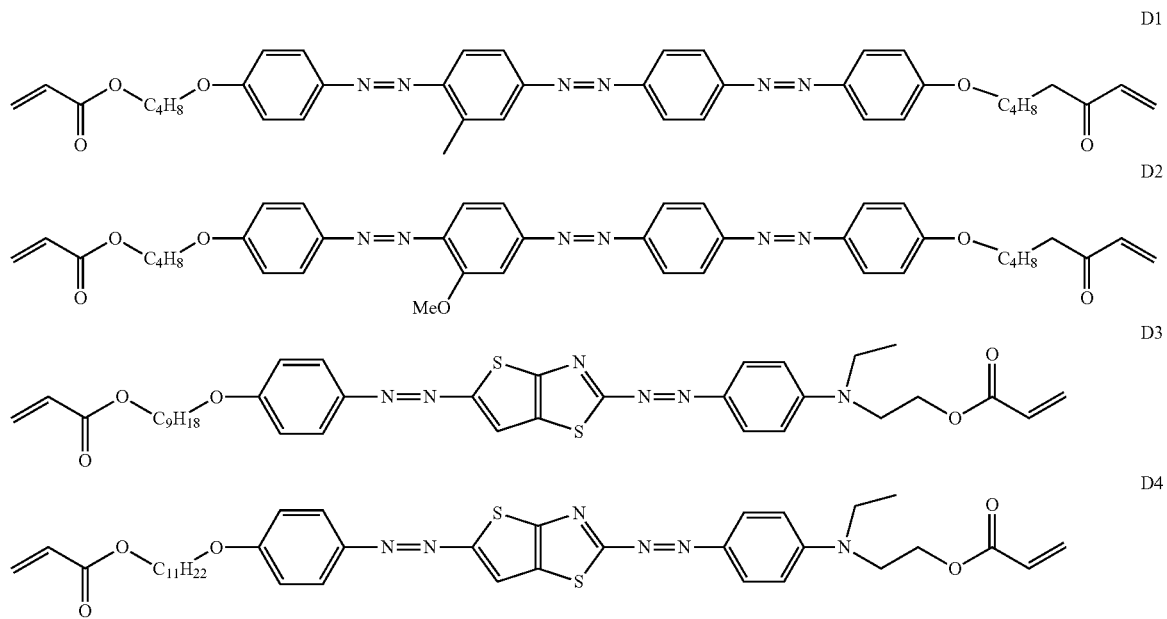 | −0.31 | 4.09 | 4.4 |

[Dichroic Substance]

The following dichroic substances D1 to D4 were prepared.

D1

D2

D3

D4

In the formula, "Me" represents a methyl group.

Example 1

[Production of Alignment Film]

A glass base (manufactured by Central Glass Co., Ltd., blue plate glass, size: 300 mm×300 mm, thickness: 1.1 mm) was washed with an alkaline detergent, and then pure water was poured thereto. After that, the glass base was dried.

The following alignment film forming composition 1 was applied to the glass base after the drying using a bar #12, and the applied alignment film forming composition 1 was dried for 2 minutes at 110° C. to form a coating film on the glass base.

The obtained coating film was subjected to a rubbing treatment (rotation speed of roller: 1,000 rotations/2.9 mm of spacer thickness, stage speed: 1.8 m/min) once to produce an alignment film 1 on the glass base.

| Composition of Alignment Film Forming Composition 1 | |
|---|---|
| Modified Vinyl Alcohol (see Formula (PVA-1)) | 2.00 parts by mass |
| Water | 74.08 parts by mass |
| Methanol | 23.86 parts by mass |
| Photopolymerization Initiator IRGACURE 2959, manufactured by BASF SE) | 0.06 parts by mass |

PVA-1

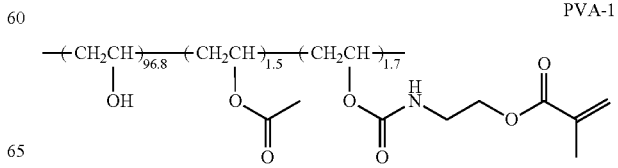

[Production of Light Absorption Anisotropic Film]

The obtained alignment film 1 was spin-coated with the following liquid crystalline composition 1 at 1,000 rpm to form a coating film.

The coating film was dried at room temperature for 30 seconds, and then heated at 180° C. for 15 seconds.

Next, the coating film was cooled to room temperature, and then irradiated with light under an irradiation condition of an illuminance of 28 mW/cm² at 80° C. using a high-pressure mercury lamp for 60 seconds to produce a light absorption anisotropic film 1 on the alignment film 1.

| Composition of Liquid Crystalline Composition 1 | |
|---|---|
| Above Polymer Liquid Crystal Compound P1 | 4.12 parts by mass |
| Above Dichroic Substance D1 | 0.82 parts by mass |
| Polymerization Initiator IRGACURE 819 (by BASF SE) | 0.04 parts by mass |
| Following Interface Improver F1 | 0.02 parts by mass |
| Chloroform | 95.00 parts by mass |

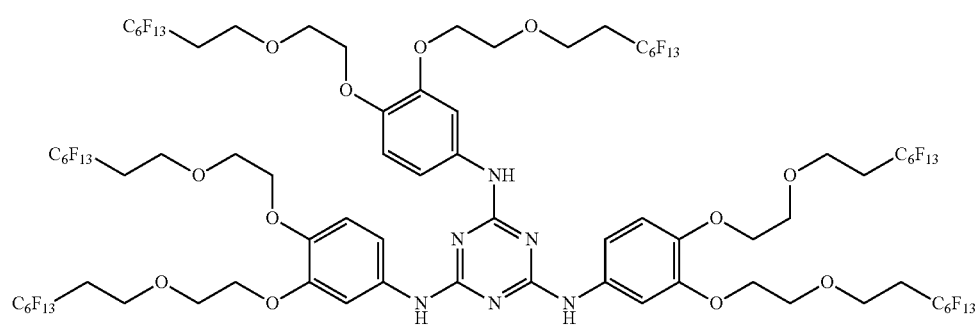

F1

Examples 2 to 19 and Comparative Examples 1 to 4

A light absorption anisotropic film was produced on the alignment film 1 in the same manner as in Example 1, except that the kind or the content of the polymer liquid crystal compound, the dichroic substance, the polymerization initiator, the interface improver, or the solvent in the liquid crystalline composition was changed as shown in the following Table 1.

Two kinds of dichroic substances were used for the liquid crystalline compositions used for producing the light absorption anisotropic films of Examples 15 to 19 and Comparative Examples 3 and 4.

In the following Table 1, an interface improver F2 is as follows.

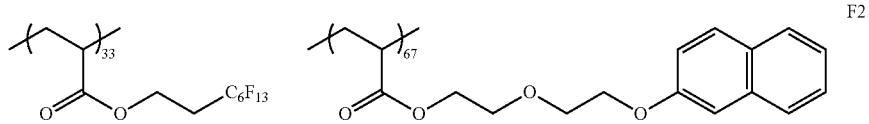

F2

[Evaluation]
[Alignment Degree]

In a state in which a linear polarizer was inserted on the light source side of an optical microscope (manufactured by Nikon Corporation, product name "ECLIPSE E600 POL"), the light absorption anisotropic film of each of the examples and the comparative examples was set on a sample table, and using a multi-channel spectroscope (manufactured by Ocean Optics, Inc., product name "QE65000"), an absorbance of the light absorption anisotropic film in a wavelength region described in Table 1 was measured to calculate an alignment degree by the following formula. The results are shown in the following Table 1.

$$S=[(Az0/Ay0)-1]/[(Az0/Ay0)+2]$$ Alignment Degree:

Az0: absorbance of light absorption anisotropic film with respect to polarization in absorption axis direction
Ay0: absorbance of light absorption anisotropic film with respect to polarization in polarization axis direction

TABLE 1

| | Polymer Liquid Crystal Compound | | Dichroic Substance | | Polymerization Initiator | | Interface Improver | | Solvent | | Evaluation Results | |
|---|---|---|---|---|---|---|---|---|---|---|---|---|
| | Kind | Amount | Kind | Amount | Kind | Amount | Kind | Amount | Kind | Amount | Alignment Degree | Wavelength Region |
| Example 1 | P1 | 4.12 | D1 | 0.82 | IRGACURE 819 | 0.04 | F1 | 0.02 | Chloroform | 95.00 | 0.96 | 400 nm to 500 nm |
| Example 2 | P2 | 4.12 | D1 | 0.82 | IRGACURE 819 | 0.04 | F1 | 0.02 | Chloroform | 95.00 | 0.96 | 400 nm to 500 nm |
| Example 3 | P3 | 4.12 | D1 | 0.82 | IRGACURE 819 | 0.04 | F1 | 0.02 | Chloroform | 95.00 | 0.96 | 400 nm to 500 nm |
| Example 4 | P4 | 3.94 | D1 | 1.02 | IRGACURE 819 | 0.02 | F1 | 0.02 | Chloroform | 95.00 | 0.95 | 400 nm to 500 mm |
| Example 5 | P1 | 4.12 | D2 | 0.82 | IRGACURE 819 | 0.04 | F1 | 0.02 | Chloroform | 95.00 | 0.97 | 400 nm to 500 nm |
| Example 6 | P1 | 4.12 | D3 | 0.82 | IRGACURE 819 | 0.04 | F1 | 0.02 | Chloroform | 95.00 | 0.96 | 500 nm to 700 nm |
| Example 7 | P7 | 4.12 | D1 | 0.82 | IRGACURE 819 | 0.04 | F1 | 0.02 | Chloroform | 95.00 | 0.96 | 400 nm to 500 nm |
| Example 8 | P8 | 4.12 | D1 | 0.82 | IRGACURE 819 | 0.04 | F1 | 0.02 | Chloroform | 95.00 | 0.96 | 400 nm to 500 nm |
| Example 9 | P9 | 4.12 | D2 | 0.82 | IRGACURE 819 | 0.04 | F1 | 0.02 | Chloroform | 95.00 | 0.97 | 400 nm to 500 nm |
| Example 10 | P10 | 4.12 | D2 | 0.82 | IRGACURE 819 | 0.04 | F1 | 0.02 | Chloroform | 95.00 | 0.97 | 400 nm to 500 nm |
| Example 11 | P11 | 4.12 | D2 | 0.82 | IRGACURE 819 | 0.04 | F1 | 0.02 | Chloroform | 95.00 | 0.95 | 400 nm to 500 nm |
| Example 12 | P8 | 4.12 | D3 | 0.82 | IRGACURE 819 | 0.04 | F1 | 0.02 | Chloroform | 95.00 | 0.96 | 500 nm to 700 nm |
| Example 13 | P9 | 4.12 | D4 | 0.82 | IRGACURE 819 | 0.04 | F1 | 0.02 | Chloroform | 95.00 | 0.96 | 500 nm to 700 nm |
| Example 14 | P9 | 4.12 | D3 | 0.82 | IRGACURE 819 | 0.04 | F1 | 0.02 | Chloroform | 95.00 | 0.96 | 500 nm to 700 nm |
| Example 15 | P1 | 3.72 | D2 D3 | 0.53 0.70 | IRGACURE 819 | 0.03 | F1 | 0.02 | Chloroform | 95.00 | 0.95 | 400 nm to 700 nm |
| Example 16 | P10 | 3.72 | D1 D3 | 0.53 0.70 | IRGACURE 819 | 0.03 | F1 | 0.02 | Chloroform | 95.00 | 0.95 | 400 nm to 700 nm |
| Example 17 | P12 | 6.38 | D1 D3 | 0.45 0.57 | IRGACURE 819 | 0.07 | F2 | 0.02 | Chloroform | 92.50 | 0.96 | 400 nm to 700 nm |
| Example 18 | P13 | 6.38 | D1 D3 | 0.45 0.57 | IRGACURE 819 | 0.07 | F2 | 0.02 | Chloroform | 92.50 | 0.96 | 400 nm to 700 nm |
| Example 19 | P14 | 6.38 | D1 D3 | 0.45 0.57 | IRGACURE 819 | 0.07 | F2 | 0.02 | Chloroform | 92.50 | 0.96 | 400 nm to 700 nm |
| Comparative Example 1 | P5 | 4.12 | D1 | 0.82 | IRGACURE 819 | 0.04 | F1 | 0.02 | Chloroform | 95.00 | 0.83 | 400 nm to 500 nm |
| Comparative Example 2 | P6 | 4.12 | D3 | 0.82 | IRGACURE 819 | 0.04 | F1 | 0.02 | Chloroform | 95.00 | 0.86 | 500 nm to 600 nm |
| Comparative Example 3 | P5 | 3.94 | D1 D3 | 0.53 0.70 | IRGACURE 819 | 0.03 | F1 | 0.02 | Chloroform | 95.00 | 0.89 | 400 nm to 700 nm |
| Comparative Example 4 | P6 | 4.12 | D2 D4 | 0.53 0.70 | IRGACURE 819 | 0.03 | F1 | 0.02 | Chloroform | 95.00 | 0.89 | 400 nm to 700 nm |

As shown in Table 1, it has been found that a light absorption anisotropic film having a high alignment degree is obtained in a case where a liquid crystalline composition containing a repeating unit in which the difference between the log $P_1$ value from the main chain to the spacer group and the log $P_2$ value of the mesogenic group is 4 or greater is used (examples).

It has been found that an alignment degree of a light absorption anisotropic film to be obtained is reduced in a case where a liquid crystalline composition not containing a repeating unit in which the difference between the log $P_1$ value from the main chain to the spacer group and the log P2 value of the mesogenic group is 4 or greater is used (comparative examples).

[Synthesis of Polymer Liquid Crystal Compounds P9-1 to P9-6]

Polymer liquid crystal compounds P9-1 to P9-6 having different weight-average molecular weights (Mw) were obtained in the same manner as in the synthesis of the polymer liquid crystal compound P9 described above, except that the amount of 2,2'-azobis(2-methylpropionic acid)dimethyl was changed in the "step 3" of the synthesis of the polymer liquid crystal compound P9. The weight-average molecular weights (Mw) of the polymer liquid crystal compounds P9 and P9-1 to P9-6 are shown below.

P9: Mw=17,000
P9-1: Mw=234,000
P9-2: Mw=38,300
P9-3: Mw=23,200
P9-4: Mw=10,900
P9-5: Mw=9,500
P9-6: Mw=6,100

Example 20

The alignment film 1 used in Example 1 was spin-coated with the following liquid crystalline composition 20 at 1,000 rpm to form a coating film 20.

[Crack Evaluation]

The obtained coating film 20 was visually observed, and cracks were evaluated based on the following criteria. The results are shown in the following Table 2.
A: No cracks are shown.
B: A few thin cracks are shown.
C: Many thick cracks are shown.

The coating film 20 was dried for 30 seconds at room temperature, and then heated for 100 seconds at 150° C. Next, the coating film 20 was cooled to room temperature, heated for 1 minute at 80° C., cooled again to room temperature, and irradiated with light under an irradiation condition of an illuminance of 28 mW/cm² at room temperature using a high-pressure mercury lamp for 50 seconds to form a light absorption anisotropic film 20.

The alignment degree was evaluated for each wavelength region described in the following Table 2 in the same manner as in Example 1. The results are shown in the following Table 2.

| Composition of Liquid Crystalline Composition 20 | |
|---|---|
| Above Polymer Liquid Crystal Compound P9-1 | 6.383 parts by mass |
| Above Dichroic Substance D1 | 0.447 parts by mass |
| Above Dichroic Substance D3 | 0.574 parts by mass |
| Polymerization Initiator IRGACURE 819 (manufactured by BASF SE) | 0.074 parts by mass |
| Above Interface Improver F2 | 0.022 parts by mass |
| Chloroform | 92.50 parts by mass |

Examples 21 to 26

A coating film was formed on the alignment film 1, and then a light absorption anisotropic film was obtained in the same manner as in Example 20, except that the kind of the polymer liquid crystal compound in the liquid crystalline composition was changed as shown in the following Table 2. The crack evaluation for the coating film and the alignment degree evaluation for the light absorption anisotropic film were performed in the same manner as in Example 20. The results are shown in the following Table 2.

Example 27

[Production of Alignment Film 27]
The alignment film forming composition 1 was applied to a transparent film (cellulose acylate film, FUJITAC TG40UL, manufactured by FUJIFILM Corporation) having a saponified surface using a bar #17, and dried for 2 minutes at 110° C. to form a coating film. The obtained coating film was subjected to a rubbing treatment (rotation speed of roller: 1,000 rotations/1.9 mm of spacer thickness, stage speed: 1.8 m/min) once to produce an alignment film 27 on the transparent film.

[Production of Light Absorption Anisotropic Film 27]
The following liquid crystalline composition 27 was applied to the obtained alignment film 27 using a bar #15 to form a coating film 27, and cracks were evaluated in the same manner as in Example 20. The evaluation results are shown in the following Table 3.

The coating film 27 was heated for 100 seconds at 150° C. Next, the coating film 27 was cooled to room temperature, heated for 1 minute at 80° C., cooled again to room temperature, and irradiated with light under an irradiation condition of an illuminance of 28 mW/cm² at room temperature using a high-pressure mercury lamp for 50 seconds to form a light absorption anisotropic film 27. The alignment degree of the light absorption anisotropic film 27 was evaluated for each wavelength region in the same manner as in Example 20. The results are shown in the following Table 3.

| Composition of Liquid Crystalline Composition 27 | |
|---|---|
| Above Polymer Liquid Crystal Compound P9-1 | 9.438 parts by mass |
| Above Dichroic Substance D1 | 0.661 parts by mass |
| Above Dichroic Substance D3 | 0.849 parts by mass |
| Polymerization Initiator IRGACURE 819 (manufactured by BASF SE) | 0.109 parts by mass |
| Above Interface Improver F2 | 0.033 parts by mass |
| Tetrahydrofuran | 62.24 parts by mass |
| Cyclopentanone | 26.67 parts by mass |

Examples 28 and 29

A coating film was formed on the alignment film 27, and then a light absorption anisotropic film was obtained in the

TABLE 2

| | Polymer Liquid Crystal Compound Kind | Dichroic Substance Kind | Polymerization Initiator Kind | Interface Improver Kind | Solvent Kind | Crack | Alignment Degree | | | |
|---|---|---|---|---|---|---|---|---|---|---|
| | | | | | | | 400 nm to 700 nm | 400 nm to 500 nm | 500 nm to 600 nm | 600 nm to 700 nm |
| Example 20 | P9-1 | D1 D3 | IRGACURE 819 | F2 | Chloroform | A | 0.92 | 0.91 | 0.93 | 0.92 |
| Example 21 | P9-2 | D1 D3 | IRGACURE 819 | F2 | Chloroform | B | 0.91 | 0.91 | 0.91 | 0.91 |
| Example 22 | P9-3 | D1 D3 | IRGACURE 819 | F2 | Chloroform | B | 0.91 | 0.90 | 0.91 | 0.92 |
| Example 23 | P9 | D1 D3 | IRGACURE 819 | F2 | Chloroform | B | 0.91 | 0.91 | 0.92 | 0.90 |
| Example 24 | P9-4 | D1 D3 | IRGACURE 819 | F2 | Chloroform | B | 0.92 | 0.90 | 0.92 | 0.92 |
| Example 25 | P9-5 | D1 D3 | IRGACURE 819 | F2 | Chloroform | C | 0.94 | 0.93 | 0.94 | 0.96 |
| Example 26 | P9-6 | D1 D3 | IRGACURE 819 | F2 | Chloroform | C | 0.94 | 0.93 | 0.95 | 0.96 | same manner as in Example 27, except that the kind of the polymer liquid crystal compound in the liquid crystalline composition was changed as shown in the following Table 3. The crack evaluation for the coating film and the alignment degree evaluation for the light absorption anisotropic film were performed in the same manner as in Example 27. The results are shown in the following Table 3.

A DMAc solution (2.9 mL) of 1.00 g of the compound (P1-2) and 57 mg of the compound (P-A) was heated to 80°

TABLE 3

|  | Polymer Liquid Crystal Compound Kind | Dichroic Substance Kind | Polymerization Initiator Kind | Interface Improver Kind | Solvent Kind | Crack | Alignment Degree | | | |
|---|---|---|---|---|---|---|---|---|---|---|
|  |  |  |  |  |  |  | 400 nm to 700 nm | 400 nm to 500 nm | 500 nm to 600 am | 600 nm to 700 nm |
| Example 27 | P9-1 | D1 D3 | IRGACURE 819 | F2 | Tetrahydrofuran and Cyclopentanone | A | 0.92 | 0.91 | 0.92 | 0.92 |
| Example 28 | P9 | D1 D3 | IRGACURE 819 | F2 | Tetrahydrofuran and Cyclopentanone | B | 0.91 | 0.91 | 0.91 | 0.92 |
| Example 29 | P9-5 | D1 D3 | IRGACURE 819 | F2 | Tetrahydrofuran and Cyclopentanone | C | 0.94 | 0.93 | 0.94 | 0.96 |

As shown in Tables 2 and 3, it has been found that a light absorption anisotropic film having few cracks is obtained in a case where a polymer liquid crystal compound having a weight-average molecular weight of 10,000 or greater is used (Examples 20 to 24, 27, and 28). In addition, as shown in Tables 2 and 3, it has been found that a light absorption anisotropic film having a high alignment degree is obtained in a case where a polymer liquid crystal compound having a weight-average molecular weight of less than 10,000 is used (Examples 25, 26, and 29).

[Synthesis of Polymer Liquid Crystal Compound (P1-A)

A polymer liquid crystal compound (P1-A) as a star polymer was synthesized as follows. In Formula (P1-A), the "S" atom and the main chain of "PL" are directly bonded to each other.

A DMAc solution (2.9 mL) of 1.00 g of the compound (P1-2) and 57 mg of the compound (P-A) was heated to 80° C. under a nitrogen stream. 9.1 mg of 2,2'-azobis(2-methylpropylene acid)dimethyl was added thereto, and heating was performed for 2 hours at 80° C. Thereafter, disappearance of the polymerizable group was confirmed by $^1$H-NMR spectrum measurement, and the solution was cooled to room temperature. 300 mL of methanol was added for filtering, and the residues were washed with methanol to obtain 0.96 g of a polymer liquid crystal compound (P1-A) as a white solid.

A weight-average molecular weight (Mw) of the obtained polymer liquid crystal compound (P1-A) was 11,300.

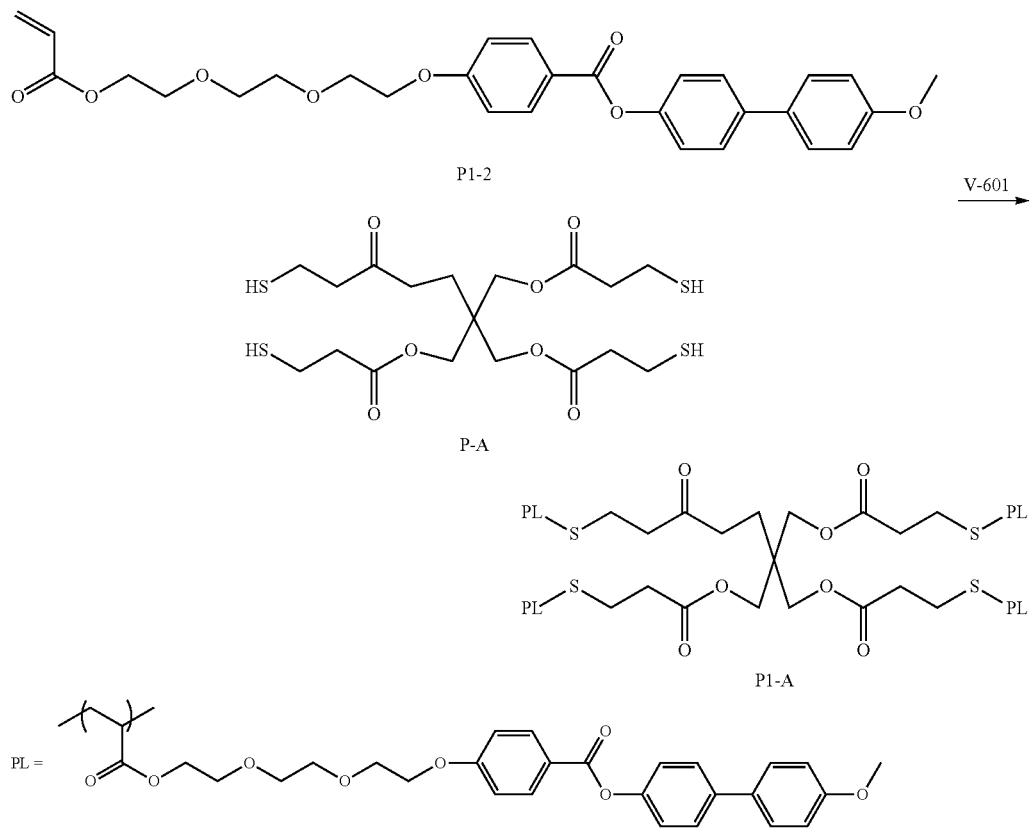

[Synthesis of Polymer Liquid Crystal Compound (P1-B)]

A polymer liquid crystal compound (P1-B) as a star polymer was synthesized as follows. In Formula (P1-B), the "S" atom and the main chain of "PL" are directly bonded to each other.

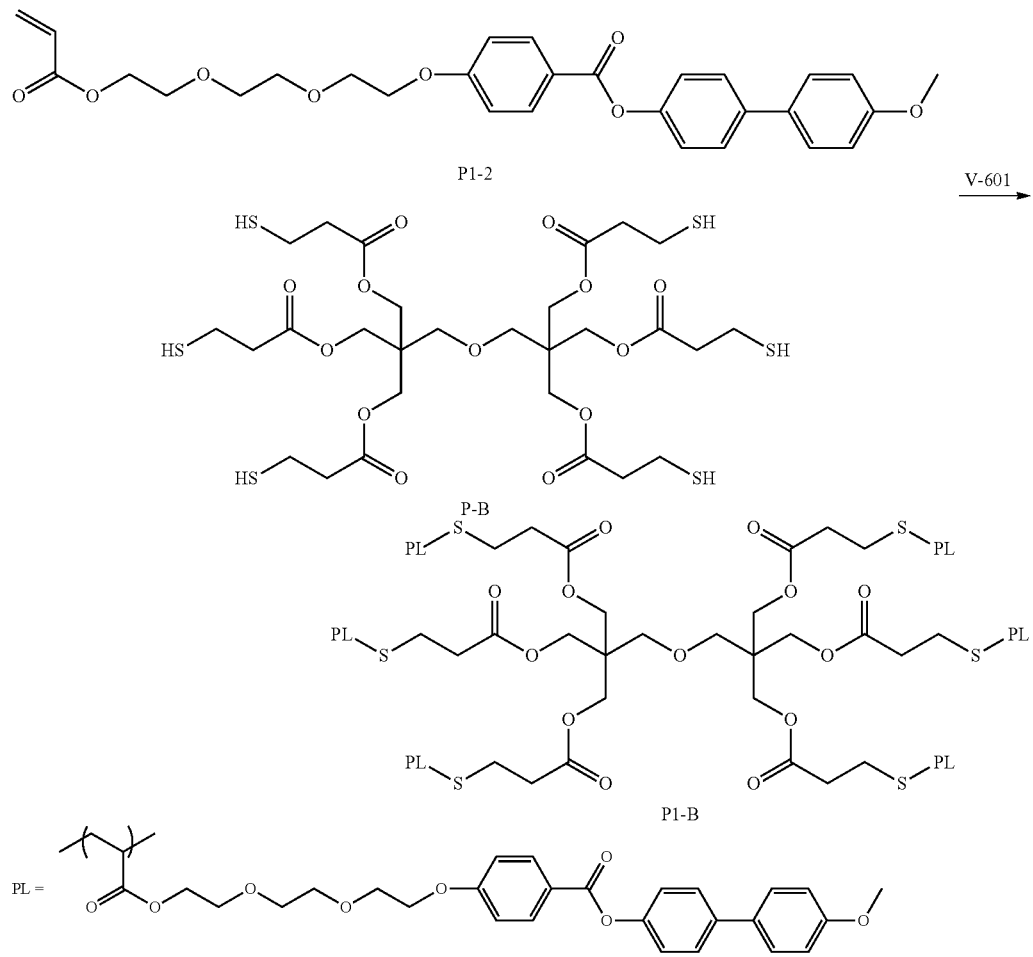

A DMAc solution (2.9 mL) of 1.00 g of the compound (P1-2) and 92 mg of the compound (P-B) was heated to 80° C. under a nitrogen stream. 9.1 mg of 2,2'-azobis(2-methylpropylene acid)dimethyl was added thereto, and heating was performed for 2 hours at 80° C. Thereafter, disappearance of the polymerizable group was confirmed by $^1$H-NMR spectrum measurement, and the solution was cooled to room temperature. 300 mL of methanol was added for filtering, and the residues were washed with methanol to obtain 0.96 g of a polymer liquid crystal compound (P1-B) as a white solid.

A weight-average molecular weight (Mw) of the obtained polymer liquid crystal compound (P1-B) was 11,800.

[Solubility Evaluation]

A polymer liquid crystal compound (polymer liquid crystal compound (P1), polymer liquid crystal compound (P1-A), or polymer liquid crystal compound (P1-B)) was added to a solvent shown in the following Table 4 such that a predetermined concentration is reached, and the solubility of the polymer liquid crystal compound was evaluated according to the following evaluation criteria. The results are shown in the following Table 4.

AA: The compound is dissolved by stirring for 10 minutes at 45° C., and the resulting mixture becomes transparent. The mixture is transparent even after leaving for 6 days at room temperature.

A: The compound is dissolved by stirring for 10 minutes at 45° C., and the resulting mixture becomes transparent. The mixture is transparent after leaving for 2 days at room temperature, but becomes cloudy after leaving for 6 days at room temperature.

B: The compound is dissolved by stirring for 10 minutes at 45° C., and the resulting mixture becomes transparent. The mixture is transparent after leaving for 1 day at room temperature, but becomes cloudy after leaving for 2 days at room temperature.

C: The compound is dissolved by stirring for 10 minutes at 45° C., and the resulting mixture becomes transparent. The mixture is transparent after leaving for 60 minutes at room temperature, but becomes cloudy after leaving for 1 day at room temperature.

D: The compound is dissolved by stirring for 10 minutes at 45° C., and the resulting mixture becomes transparent. The mixture is transparent after leaving for 5 minutes at room temperature, but becomes cloudy after leaving for 60 minutes at room temperature.

E: The compound is dissolved by stirring for 10 minutes at 45° C., and the resulting mixture becomes transparent.

The mixture is transparent after leaving for 1 minute at room temperature, but becomes cloudy after leaving for 5 minutes at room temperature.

F: The compound is not dissolved by stirring for 10 minutes at 45° C.

As shown in Tables 4 and 5, it has been found that the polymer liquid crystal compounds (P1-A and P1-B) as star polymers can form a light absorption anisotropic film having a high alignment degree while having excellent solubility (Examples 31 and 32).

TABLE 4

| Polymer Liquid Crystal Compound (P1) | | | | Polymer Liquid Crystal Compound (P1-A) | | | | Polymer Liquid Crystal Compound (P1-B) | | | |
|---|---|---|---|---|---|---|---|---|---|---|---|
| Concentration | Tetrahydrofuran | Cyclopentanone | Solubility | Concentration | Tetrahydrofuran | Cyclopentanone | Solubility | Concentration | Tetrahydrofuran | Cyclopentanone | Solubility |
| 10% | 85% | 15% | C | 10% | 85% | 15% | A | 10% | 85% | 15% | A |
| 15% | 85% | 15% | C | 15% | 85% | 15% | B | 15% | 85% | 15% | B |
| 20% | 85% | 15% | D | 20% | 85% | 15% | C | 20% | 85% | 15% | C |
| 25% | 85% | 15% | F | 25% | 85% | 15% | E | 25% | 85% | 15% | D |
| 10% | 30% | 70% | C | 10% | 30% | 70% | AA | 10% | 30% | 70% | AA |
| 15% | 30% | 70% | C | 15% | 30% | 70% | A | 15% | 30% | 70% | A |
| 20% | 30% | 70% | D | 20% | 30% | 70% | C | 20% | 30% | 70% | C |
| 25% | 30% | 70% | F | 25% | 30% | 70% | D | 25% | 30% | 70% | C |

Example 30

A light absorption anisotropic film was obtained in the same manner as in Example 20, except that the following liquid crystalline composition 30 was used instead of the liquid crystalline composition 20. The alignment degree evaluation for the light absorption anisotropic film was performed in the same manner as in Example 20. The results are shown in the following Table 5.

| Composition of Liquid Crystalline Composition 30 | |
|---|---|
| Above Polymer Liquid Crystal Compound P1 | 6.383 parts by mass |
| Above Dichroic Substance D1 | 0.447 parts by mass |
| Above Dichroic Substance D3 | 0.574 parts by mass |
| Polymerization Initiator IRGACURE 819 (manufactured by BASF SE) | 0.074 parts by mass |
| Above Interface Improver F2 | 0.022 parts by mass |
| Chloroform | 92.50 parts by mass |

Examples 31 and 32

A light absorption anisotropic film was obtained in the same manner as in Example 30, except that the kind of the polymer liquid crystal compound in the liquid crystalline composition 30 was changed to the polymer liquid crystal compound P1-A or P1-B as a star polymer. The alignment degree evaluation for the light absorption anisotropic film was performed in the same manner as in Example 30. The results are shown in the following Table 5.

Example 33

[Production of Alignment Film 33]

The alignment film forming composition 1 was applied to a transparent film (cellulose acylate film, FUJITAC TG40UL, manufactured by FUJIFILM Corporation) having a saponified surface using a bar #17, and dried for 2 minutes at 110° C. to form a coating film.

Next, 41.6 parts by mass of hutoxyethanol, 41.6 parts by mass of dipropylene glycol monomethyl, and 15.8 parts by mass of pure water were added to 1 part by mass of a photo-alignment material E-1 having the following structure, and the obtained solution was filtered under pressure with a 0.45 μm membrane filter to prepare a photo-alignment film coating liquid 33. The obtained photo-alignment film coating liquid 33 was applied to the above-described coating film, and dried for 1 minute at 60° C. The coating film obtained using the photo-alignment film coating liquid was irradiated with linearly polarized ultraviolet rays (illuminance: 4.5 mW, irradiation dose: 500 mJ/cm$^2$) using a polarized ultraviolet exposure device to produce an alignment film 33.

TABLE 5

| | Polymer Liquid Crystal Compound Kind | Dichroic Substance Kind | Polymerization Initiator Kind | Interface Improver Kind | Solvent Kind | Alignment Degree | | | |
|---|---|---|---|---|---|---|---|---|---|
| | | | | | | 400 nm to 700 nm | 400 nm to 500 nm | 500 nm to 600 nm | 600 nm to 700 nm |
| Example 30 | P1 | D1 D3 | IRGACURE 819 | F2 | Chloroform | 0.94 | 0.92 | 0.94 | 0.96 |
| Example 31 | P1-A | D1 D3 | IRGACURE 819 | F2 | Chloroform | 0.94 | 0.93 | 0.94 | 0.96 |
| Example 32 | P1-B | D1 D3 | IRGACURE 819 | F2 | Chloroform | 0.94 | 0.92 | 0.94 | 0.96 |

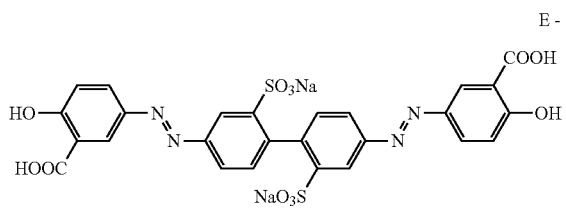

E-1

[Production of Polarizing Element 33]

The following liquid crystalline composition 33 was applied to the obtained alignment film 33 using a bar #15 to form a coating film, and the coating film was heated for 90 seconds at 140° C. Next, the coating film 33 was cooled to room temperature, heated for 1 minute at 80° C., cooled again to room temperature, and irradiated with light under an irradiation condition of an illuminance of 28 mW/cm$^2$ at room temperature using a high-pressure mercury lamp for 60 seconds to form a light absorption anisotropic film 33.

| Composition of Liquid Crystalline Composition 33 | |
| --- | --- |
| Above Polymer Liquid Crystal Compound P12 | 10.20 parts by mass |
| Above Dichroic Substance D1 | 0.71 parts by mass |
| Above Dichroic Substance D3 | 0.92 parts by mass |
| Polymerization Initiator IRGACURE 819 (manufactured by BASF SE) | 0.06 parts by mass |
| Above Interface Improver F2 | 0.02 parts by mass |
| Cyclopentanone | 61.66 parts by mass |
| Tetrahydrofuran | 26.43 parts by mass |

Next, the following barrier layer forming composition 33 was continuously applied to the light absorption anisotropic film 33 using a wire bar #30, and dried for 5 minutes at 60° C. to obtain a polarizing element 33 in which a barrier layer 33 was formed on the light absorption anisotropic film 33.

| Barrier Layer Forming Composition 33 | |
| --- | --- |
| Compound BA-1 (described below) | 29 parts by mass |
| Polymerization Initiator IRGACURE 819 (manufactured by BASF SE) | 1 part by mass |
| Ethanol | 70 parts by mass |

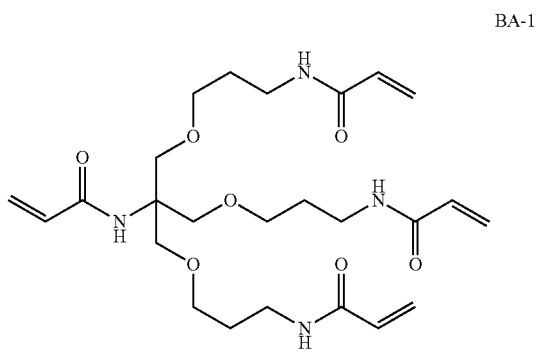 [SMILES: C=CC(=O)NCCCOCC(COCCCNC(=O)C=C)(COCCCNC(=O)C=C)NC(=O)C=C]

BA-1

[Production of λ/4 Retardation Film 1]

<Preparation of Liquid Crystal Alignment Agent>

An optically anisotropic layer coating liquid having the following composition was prepared. The optically anisotropic layer coating liquid was added to butyl acetate and stirred, and then filtered with a filter having a pore size of 1 μm to prepare a liquid crystal alignment agent having a solid content concentration of 7.5 wt %. In the obtained liquid crystal alignment agent, the polymer A-1 and other components were sufficiently dissolved in the solvent as added.

| Optically Anisotropic Layer Coating Liquid | |
| --- | --- |
| Following Liquid Crystal Compound L-3 | 42.00 parts by mass |
| Following Liquid Crystal Compound L-4 | 42.00 parts by mass |
| Following Polymerizable Compound A-1 | 16.00 parts by mass |
| Following Low-Molecular-Weight Compound B-2 | 6.00 parts by mass |
| Following Polymerization Initiator S-1 (oxime type) | 0.50 parts by mass |
| Following Leveling Agent G-1 | 0.20 parts by mass |
| HISOLVE MTEM (manufactured by TOHO Chemical Industry Co., Ltd.) | 2.00 parts by mass |
| NK ESTER A-200 (manufactured by Shin-Nakamura Chemical Co., Ltd) | 1.00 parts by mass |
| Methyl Ethyl Ketone | 424.8 parts by mass |

The group adjacent to the acryloyloxy group of the following liquid crystal compounds L-3 and L-4 represents a propylene group (a group in which a methyl group is substituted by an ethylene group), and each of the following liquid crystal compounds L-3 and L-4 represents a mixture of position isomers with different here methyl group positions.

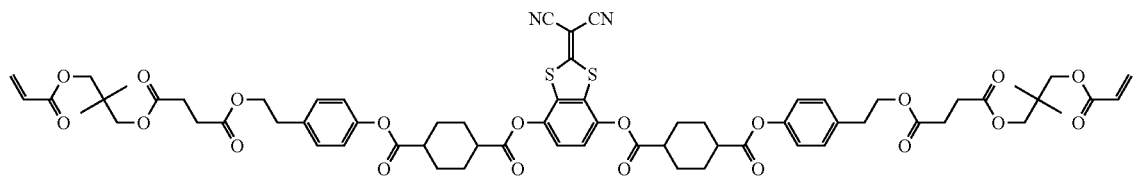

L-3

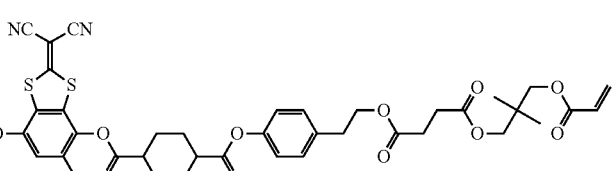

L-4

-continued

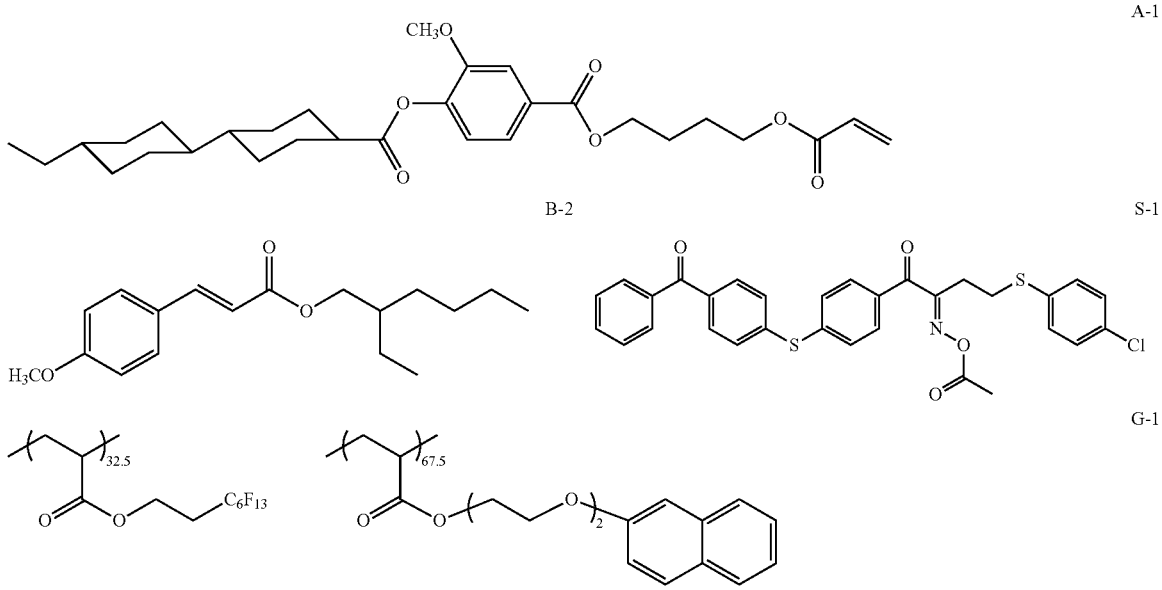

<Production of Cellulose Acylate Film 1>

(Production of Core Layer Cellulose Acylate Dope)

The following composition was put into a mixing tank and stirred to dissolve components, and a cellulose acetate solution to be used as a core layer cellulose acylate dope was prepared.

| Core Layer Cellulose Acylate Dope | |
|---|---|
| Cellulose Acetate Having Acetyl Substitution Degree of 2.88 | 100 parts by mass |
| Polyester Compound B Described in Examples of JP2015-227955A | 12 parts by mass |
| Following Compound F | 2 parts by mass |
| Methylene Chloride (first solvent) | 430 parts by mass |
| Methanol (second solvent) | 64 parts by mass |

(F)

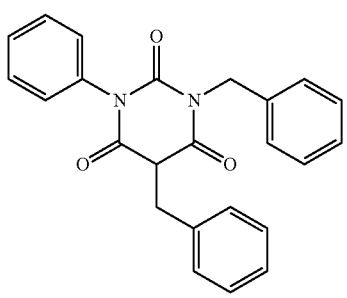

(Production of Outer Layer Cellulose Acylate Dope)

10 parts by mass of the following matting agent solution was added to 90 parts by mass of the above-described core layer cellulose acylate dope to prepare a cellulose acetate solution to be used as an outer layer cellulose acylate dope.

| Matting Agent Solution | |
|---|---|
| Silica Particles Having Average Particle Size of 20 nm (AEROSIL R972, manufactured by NIPPON AEROSIL CO., LTD.) | 2 parts by mass |
| Methylene Chloride (first solvent) | 76 parts by mass |
| Methanol (second solvent) | 11 parts by mass |
| Above Core Layer Cellulose Acylate Dope | 1 part by mass |

(Production of Cellulose Acylate Film 1)

The core layer cellulose acylate dope and the outer layer cellulose acylate dope were filtered with filter paper having an average pore size of 34 μm and a sintered metallic filter having an average pore size of 10 μm, and then the three layers of the core layer cellulose acylate dope and the outer layer cellulose acylate dopes on both sides of the core layer cellulose acylate dope were simultaneously cast on a drum at 20° C. from an outlet (band casting machine). The film was peeled off in a state in which the solvent content was about 20 mass %, and both ends in a width direction of the film were fixed by a tenter clip. The film was dried while being stretched in a transverse direction at a stretching ratio of 1.1. Then, the film was further dried by being transported between rolls of a heat treatment device, and a cellulose acylate film 1 having a thickness of 40 μm was obtained. The in-plane retardation of the obtained cellulose acylate film 1 was 0 nm.

<Production of λ/4 Retardation Film 1>

Using the alignment film forming composition 1 and the photo-alignment film coating liquid 33, an alignment film 33 was formed on one surface of the produced cellulose acylate film 1 in the same manner as in the case of the production of the alignment film 33. Next, a liquid crystal alignment agent prepared previously was applied to the alignment film 33 using a bar coater to form a composition layer. The formed composition layer was heated to 110° C. once on a hot plate, and then cooled to 60° C. to stabilize the alignment. Thereafter, the temperature was maintained to 60° C., and the alignment was fixed by ultraviolet irradiation (500 mJ/cm$^2$, using an ultra-high-pressure mercury lamp) under a nitrogen atmosphere (oxygen concentration: 100 ppm) to form an optically anisotropic layer having a thickness of 2.3 μm, and λ/4 retardation film 1 was produced. The in-plane retardation of the obtained λ/4 retardation film 1 was 140 nm.

[Production of Positive C-Plate Film]

A commercially available triacetyl cellulose film "Z-TAC" (manufactured by FUJIFILM Corporation) was used as a temporary support (this is referred to as a cellulose acylate film 2). A surface temperature of the cellulose acylate film 2 was increased to 40° C. by passing the film through a dielectric heating roll at a temperature of 60° C., and then an alkaline solution having the following composition was applied to one side of the film at a coating rate of 14 mL/m$^2$ using a bar coater, heated to 110° C., and transported for 10 seconds under a steam-type far-infrared heater manufactured by NORITAKE CO., LIMITED. Next, pure water was applied using the same bar coater at 3 mL/m$^2$. Next, water washing by a fountain coater and draining by an air knife were repeated three times, and then the film was transported to a drying zone at 70° C. for 10 seconds and dried to produce an alkali-saponified cellulose acylate film 2.

| Composition of Alkaline Solution | |
|---|---|
| Potassium Hydroxide | 4.7 parts by mass |
| Water | 1.58 parts by mass |
| Isopropanol | 63.7 parts by mass |
| Surfactant SF-1 ($C_{14}H_{29}O(CH_2CH_2O)_{20}H$) | 1.0 part by mass |
| Propylene Glycol | 14.8 parts by mass |

The above-described alkali-saponified cellulose acylate film 2 was used, and an alignment film forming coating liquid having the following composition was continuously applied thereto using a wire bar #8. The liquid was dried for 60 seconds by hot air at 60° C., and further dried for 120 seconds by hot air at 100° C. to form an alignment film.

| Composition of Alignment Film Forming Coating Liquid | |
|---|---|
| Polyvinyl Alcohol (manufactured by KURARAY CO., LTD., PVA103) | 2.4 parts by mass |
| Isopropyl Alcohol | 1.6 parts by mass |
| Methanol | 36 parts by mass |
| Water | 60 parts by mass |

The following optical anisotropic film coating liquid N was applied to the cellulose acylate film 2 having the alignment film produced as described above. After aging for 60 seconds at 60° C., the film was irradiated with 1,000 mJ/cm$^2$ of ultraviolet rays using an air-cooling metal halide lamp (manufactured by EYE GRAPHICS Co., Ltd.) of 70 mW/cm$^2$ in the air to fix the alignment state. Accordingly, the polymerizable rod-like liquid crystal compound was vertically aligned, and a positive C-plate film 2 was produced. Rth at a wavelength of 550 nm was −60 nm.

| Composition of Optical Anisotropic Film coating Liquid N | |
|---|---|
| Following Liquid Crystal Compound L-1 | 80 parts by mass |
| Following Liquid Crystal Compound L-2 | 20 parts by mass |
| Following Vertical Alignment Agent S01 | 1.5 parts by mass |
| Ethylene Oxide-Modified Trimethylolpropane Triacrylate (V#360, manufactured by OSAKA ORGANIC CHEMICAL INDUSTRY LTD.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| Following Compound B03 | 0.4 parts by mass |
| Methyl Ethyl Ketone | 170 parts by mass |
| Cyclohexanone | 30 parts by mass |

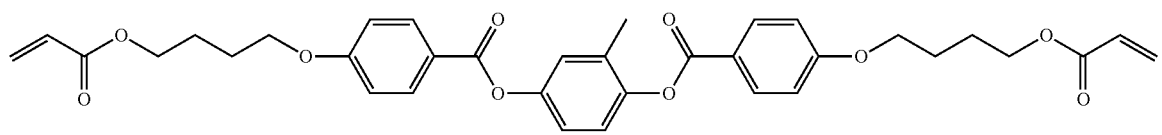

L-1

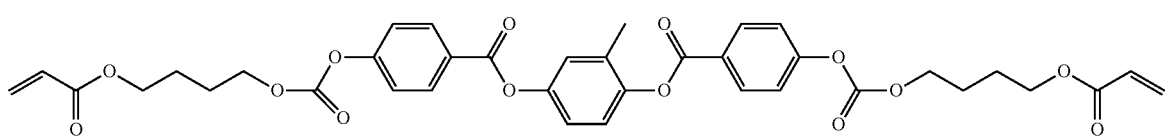

L-2

-continued

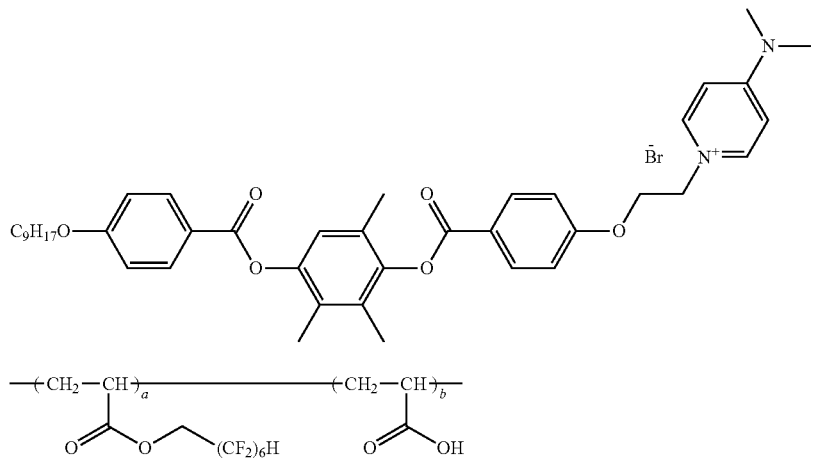

S01

B03

In Formula (B03), a:b=90:10 (mass ratio) is satisfied.

(Production of Circularly Polarizing Plate)

The positive C-plate film 2 produced as described above was transferred to the optically anisotropic layer side of the λ/4 retardation film 1 via a pressure sensitive adhesive, and the cellulose acylate film 2 was removed. Then, the side of the cellulose acylate film 1 of the λ/4 retardation film 1 was laminated on the barrier layer 33 of the polarizing element 33 via a pressure sensitive adhesive to obtain a circularly polarizing plate 33.

The alignment degree evaluation for the circularly polarizing plate 33 was performed for each wavelength region in the same manner as in Example 20. The results are shown in the following Table 6.

Examples 34 and 35

Polarizing elements 34 and 35 and circularly polarizing plates 34 and 35 were produced in the same manner as in Example 33, except that the kind of the polymer liquid crystal compound in the liquid crystalline composition was changed as shown in the following Table 6. The alignment degree evaluation for the circularly polarizing plate was performed in the same manner as in Example 33. The results are shown in the following Table 6.

Example 36

[Production of Alignment Film 36]

A solution obtained by adding, to 0.67 parts by mass of the photo-alignment material E-1, 0.33 parts by mass of DENACOL ACRYLATE DA-212 manufactured by Nagase ChemteX Corporation, 41.6 parts by mass of butoxyethanol, 41.6 parts by mass of dipropylene glycol monomethyl, and 15.8 parts by mass of pure water was filtered under pressure with a 0.45 μm membrane filter to produce a photo-alignment film coating liquid 36. The obtained photo-alignment film coating liquid 36 was applied to the coating film of the alignment film forming composition 1 provided on the saponified TG40UL used for the alignment film 33. The liquid was dried for 1 minute at 60° C. The obtained coating film was irradiated with linearly polarized ultraviolet rays (illuminance: 4.5 mW, irradiation dose: 500 mJ/cm$^2$) using a polarized ultraviolet exposure device to produce an alignment film 36.

Using the alignment film 36, a polarizing element 36 and a circularly polarizing plate 36 were formed in the same manner as in Example 33, except that the kind of the polymer liquid crystal compound in the liquid crystalline composition was changed as shown in the following Table 6. The alignment degree evaluation for the circularly polarizing plate 36 was performed in the same manner as in Example 33. The results are shown in the following Table 6.

Example 37

[Production of Alignment Film 37]

<Synthesis of Polymer C-2>

A reaction container provided with a stirrer, a thermometer, a dropping funnel, and a reflux cooling pipe was charged with 100.0 parts by mass of 2-(3,4-epoxycyclohexyl)ethyltrimethoxysilane, 500 parts by mass of methyl isobutyl ketone, and 10.0 parts by mass of triethylamine, and the mixture was stirred at room temperature. Next, 100 parts by mass of deionized water was added dropwise to the obtained mixture from the dropping funnel for 30 minutes. Then, a reaction was caused for 6 hours at 80° C. during mixing of the mixture under reflux. After the reaction was terminated, the organic phase was taken out and washed with a 0.2 mass % aqueous ammonium nitrate solution until the water after washing became neutral. Thereafter, from the obtained organic phase, the solvent and the water were distilled off under reduced pressure to obtain an epoxy group-containing polyorganosiloxane as a viscous transparent liquid.

$^1$H-NMR (Nuclear Magnetic Resonance) analysis was performed on the epoxy group-containing polyorganosiloxane, and it was confirmed that a peak based on an oxiranyl group was obtained in accordance with a theoretical intensity in the vicinity of a chemical shift (δ)=3.2 ppm, and a side reaction of the epoxy group did not occur during the reaction. A weight-average molecular weight Mw of the epoxy group-containing polyorganosiloxane was 2,200, and the epoxy equivalent was 186 g/mol.

Next, 100 mL of a three-neck flask was charged with 10.1 parts by mass of the epoxy group-containing polyorganosiloxane obtained as described above, 0.5 parts by mass of an acrylic group-containing carboxylic acid (TOAGOSEI CO., LTD., trade name "ARONIX M-5300", ω-carboxy polycaprolactone acrylate (polymerization degree n≈0.2)), 20 parts by mass of butyl acetate, 1.5 parts by mass of a cinnamic acid derivative obtained by the method of Synthesis Example 1 in JP2015-026050A, and 0.3 parts by mass of tetrabutylammonium bromide, and the obtained mixture was stirred for 12 hours at 90° C. After the stirring, the obtained mixture was diluted with the same amount (mass) of butyl acetate, and the diluted mixture was water-washed 3 times. Concentration of the obtained mixture and dilution with butyl acetate were repeated 2 times, and finally, a solution containing a polyorganosiloxane (the following polymer C-2) having a photo-aligned group was obtained. A weight-average molecular weight Mw of the polymer C-2 was 9,000. In addition, as a result of $^1$H-NMR analysis, a component having a cinnamate group in the polymer C-2 was 23.7 mass %.

Additive (B-1): TA-60B (see the following structural formula) manufactured by San-Apro Ltd.

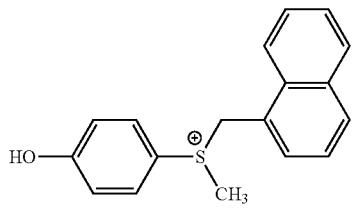

Polymer C-2

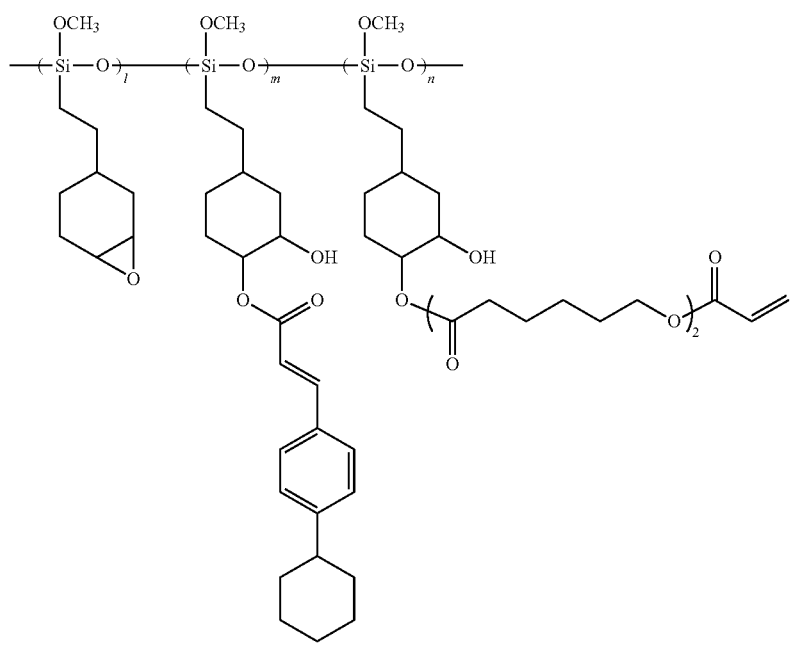

<Preparation of Alignment Layer Forming Composition 37>

An alignment layer forming composition 37 was prepared by mixing the following components.

| | |
|---|---|
| Above Polymer X-2 | 10.67 parts by mass |
| Low-Molecular-Weight Compound R-1 | 5.17 parts by mass |
| Additive (B-1) | 0.53 parts by mass |
| Butyl Acetate | 8287.37 parts by mass |
| Propylene Glycol Monomethyl Ether Acetate | 2071.85 parts by mass |

R-1

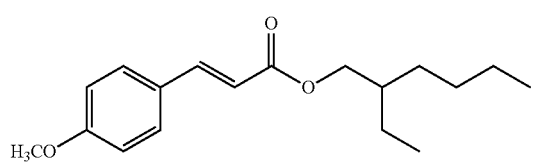

-continued

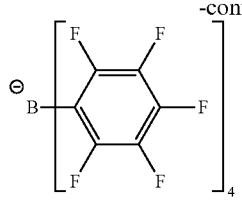

By a spin coating method, the alignment layer forming composition 37 was applied to the coating film of the alignment film forming composition 1 provided on the saponified TG40UL used for the alignment film 33, the support coated with the alignment layer forming composition 37 was dried for 5 minutes on a hot plate at 80° C. to remove the solvent, and a coating film was formed.

The obtained coating film was irradiated with polarized ultraviolet rays (25 mJ/cm$^2$, ultra-high-pressure mercury lamp), and thus an alignment film 37 was produced.

A polarizing element 37 and a circularly polarizing plate 37 were formed in the same manner as in Example 34, except for using the alignment film 37. The alignment degree evaluation for the circularly polarizing plate 37 was performed in the same manner as in Example 33. The results are shown in the following Table 6.

Example 38

[Production of Alignment Film 38]

The following alignment film forming composition 38 was applied to glass using a bar #15. The applied alignment film forming composition 38 was dried for 15 minutes at 80° C., and then heated for 1 hour at 250° C. Thus, a coating film was formed on the glass.

The obtained coating film was irradiated with polarized ultraviolet rays (1 J/cm², ultra-high-pressure mercury lamp) once to produce an alignment film 38 on the glass base.

| Composition of Alignment Film Forming Composition 38 | |
|---|---|
| SE-130 (product name, manufactured by Nissan Chemical Corporation) | 2.0 parts by mass |
| N-methylpyrrolidone | 98.0 parts by mass |

A polarizing element 38 and a circularly polarizing plate 38 were formed in the same manner as in Example 34, except for using the alignment film 38. The alignment degree evaluation for the circularly polarizing plate 38 was performed in the same manner as in Example 33. The results are shown in the following Table 6.

Example 39

A polarizing element 39 and a circularly polarizing plate 39 were produced in the same manner as in Example 33, except that the kind of the polymer liquid crystal compound in the liquid crystalline composition was changed as shown in the following Table 6. The alignment degree evaluation for the circularly polarizing plate 39 was performed in the same manner as in Example 33. The results are shown in the following Table 6.

Example 40

The following barrier layer forming composition 40 was continuously applied to the light absorption anisotropic film of Example 39 using a wire bar #17, and dried for 5 minutes at 60° C., and thus a polarizing element 40 in which a barrier layer was formed on the light absorption anisotropic film. A circularly polarizing plate 40 was formed in the same manner as in Example 39 except for using the polarizing element 40. The alignment degree evaluation for the circularly polarizing plate 40 was performed in the same manner as in Example 33. The results are shown in the following Table 6.

| Barrier Layer Forming Composition 40 | |
|---|---|
| Modified Polyvinyl Alcohol (Formula (PVA-1)) | 7 parts by mass |
| Water | 72 parts by mass |
| Methanol | 21 parts by mass |

Examples 41 and 42

Polarizing elements 41 and 42 and circularly polarizing plates 41 and 42 were produced in the same manner as in Example 33, except that the amount (parts by mass) of the dichroic substance in the liquid crystalline composition was changed as shown in the following Table 6. The alignment degree evaluation for each circularly polarizing plate was performed in the same manner as in Example 33. The results are shown in the following Table 6.

TABLE 6

| | Alignment Film | Polymer Liquid Crystal Compound | | Dichroic Substance | | Polymerization Initiator | | Interface Improver | | Cyclo-pentanone | Tetra-hydrofuran | Barrier Layer | Alignment Degree 400 nm to 700 nm |
|---|---|---|---|---|---|---|---|---|---|---|---|---|---|
| | | Kind | Amount | Kind | Amount | Kind | Amount | Kind | Amount | Amount | Amount | | |
| Example 33 | 33 | P12 | 10.20 | D1 | 0.71 | IRGACURE 819 | 0.06 | F2 | 0.02 | 61.66 | 26.43 | 33 | 0.96 |
| | | | | D3 | 0.92 | | | | | | | | |
| Example 34 | 33 | P13 | 10.20 | D1 | 0.71 | IRGACURE 819 | 0.06 | F2 | 0.02 | 61.66 | 26.43 | 33 | 0.96 |
| | | | | D3 | 0.92 | | | | | | | | |
| Example 35 | 33 | P14 | 10.20 | D1 | 0.71 | IRGACURE 819 | 0.06 | F2 | 0.02 | 61.66 | 26.43 | 33 | 0.96 |
| | | | | D3 | 0.92 | | | | | | | | |
| Example 36 | 36 | P12 | 10.20 | D1 | 0.71 | IRGACURE 819 | 0.06 | F2 | 0.02 | 61.66 | 26.43 | 33 | 0.96 |
| | | | | D3 | 0.92 | | | | | | | | |
| Example 37 | 37 | P13 | 10.20 | D1 | 0.71 | IRGACURE 819 | 0.06 | F2 | 0.02 | 61.66 | 26.43 | 33 | 0.96 |
| | | | | D3 | 0.92 | | | | | | | | |
| Example 38 | 38 | P13 | 10.20 | D1 | 0.71 | IRGACURE 819 | 0.06 | F2 | 0.02 | 61.66 | 26.43 | 33 | 0.96 |
| | | | | D3 | 0.92 | | | | | | | | |
| Example 39 | 33 | P9 | 10.20 | D1 | 0.71 | IRGACURE 819 | 0.06 | F2 | 0.02 | 61.66 | 26.43 | 33 | 0.95 |
| | | | | D3 | 0.92 | | | | | | | | |
| Example 40 | 33 | P9 | 10.20 | D1 | 0.71 | IRGACURE 819 | 0.06 | F2 | 0.02 | 61.66 | 26.43 | 40 | 0.96 |
| | | | | D3 | 0.92 | | | | | | | | |
| Example 41 | 33 | P12 | 10.20 | D1 | 0.57 | IRGACURE 819 | 0.06 | F2 | 0.02 | 61.66 | 26.43 | 33 | 0.96 |
| | | | | D3 | 1.06 | | | | | | | | |
| Example 42 | 33 | P12 | 10.20 | D1 | 0.41 | IRGACURE 819 | 0.06 | F2 | 0.02 | 61.66 | 26.43 | 33 | 0.96 |
| | | | | D3 | 1.22 | | | | | | | | |

As shown in Table 6, it has been found that a light absorption anisotropic film (polarizing element) having a high alignment degree is obtained in a case where a liquid crystalline composition containing a repeating unit in which the difference between the log $P_1$ value from the main chain to the spacer group and the log $P_2$ value of the mesogenic group is 4 or greater is used (examples).

Example 43

[Production of Polarizing Element 43]

The following liquid crystalline composition 43 was applied to the alignment film 33 of Example 33 using a bar #4 to form a coating film, and the coating film was heated for 90 seconds at 140° C. Next, the coating film was cooled to room temperature, heated for 1 minute at 80° C., cooled again to room temperature, and irradiated with light under an irradiation condition of an illuminance of 28 mW/cm$^2$ at room temperature using a high-pressure mercury lamp for 60 seconds to form a light absorption anisotropic film 43. A polarizing element 43 and a circularly polarizing plate 43 were produced in the same manner as in Example 33, except for the above changes.

The alignment degree evaluation for the circularly polarizing plate 43 was performed for each wavelength region in the same manner as in Example 20. The results are shown in the following Table 7.

| Composition of Liquid Crystalline Composition 43 | |
|---|---|
| Above Polymer Liquid Crystal Compound P13 | 10.18 parts by mass |
| Above Dichroic Substance D1 | 0.71 parts by mass |
| Above Dichroic Substance D3 | 0.92 parts by mass |
| Polymerization Initiator IRGACURE 819 (manufactured by BASF SE) | 0.06 parts by mass |
| Above Interface Improver F2 | 0.04 parts by mass |
| Cyclopentanone | 61.66 parts by mass |
| Tetrahydrofuran | 26.43 parts by mass |

Examples 44 to 46

Polarizing elements 44 to 46 and circularly polarizing plates 44 to 46 were produced in the same manner as in Example 43, except that the composition used for producing the light absorption anisotropic film was changed to a composition shown in the following Table 7.

The alignment degree evaluation for the circularly polarizing plates 44 to 46 was performed for each wavelength region in the same manner as in Example 20. The results are shown in the following Table 7.

As shown in Table 7, it has been found that a light absorption anisotropic film (polarizing element) having a high alignment degree is obtained in a case where a liquid crystalline composition containing a repeating unit in which the difference between the log $P_1$ value from the main chain to the spacer group and the log $P_2$ value of the mesogenic group is 4 or greater is used (examples).

What is claimed is:

1. A liquid crystalline composition comprising:
a polymer liquid crystal compound which contains a repeating unit represented by Formula (1); and
a dichroic substance,
wherein the dichroic substance is a visible light absorbing substance,
wherein in Formula (1), a difference between a log P value of P1, L1, and SP1 and a log P value of M1 is 4 or greater, and
wherein the polymer liquid crystal compound is a star polymer represented by Formula (4),

in Formula (1), P1 represents a main chain of the repeating unit represented by Formula (P1-A), L1 includes at least one selected from the group consisting of —C(O)O—, —OC(O)—, —O—, —S—, —C(O)NR$^3$—, —NR$^3$C(O)—, —S(O)$_2$—, and —NR$^3$R$^4$—, in the formula, R$^3$ and R$^4$ each independently represent a hydrogen atom or an alkyl group having 1 to 6 carbon atoms which may have a substituent, SP1 includes at least one selected from the group consisting of an oxyethylene structure, an oxypropylene structure, a polysiloxane structure, and a fluorinated alkylene structure, M1 is a group represented by Formula (M1-A) or (M1-B), and T1 represents a terminal group,

TABLE 7

| | Alignment Film | Polymer Liquid Crystal Compound | | Dichroic Substance | | Polymerization Initiator | | Interface Improver | | Cyclopentanone | Tetrahydrofuran | Barrier Layer | Alignment Degree 400 nm to 700 nm |
|---|---|---|---|---|---|---|---|---|---|---|---|---|---|
| | | Kind | Amount | Kind | Amount | Kind | Amount | Kind | Amount | Amount | Amount | | |
| Example 43 | 33 | P13 | 10.18 | D1<br>D3 | 0.71<br>0.92 | IRGACURE 819 | 0.06 | F2 | 0.04 | 61.66 | 26.43 | 33 | 0.96 |
| Example 44 | 33 | P12 | 10.18 | D1<br>D3 | 0.71<br>0.92 | IRGACURE 819 | 0.06 | F2 | 0.04 | 61.66 | 26.43 | 33 | 0.96 |
| Example 45 | 33 | P12 | 10.18 | D1<br>D3 | 0.57<br>1.06 | IRGACURE 819 | 0.06 | F2 | 0.04 | 61.66 | 26.43 | 33 | 0.96 |
| Example 46 | 33 | P12 | 10.18 | D1<br>D3 | 0.41<br>1.22 | IRGACURE 819 | 0.06 | F2 | 0.04 | 61.66 | 26.43 | 33 | 0.96 |

$R^1$ represents a hydrogen atom or a methyl group,

 (M1-A)

 (M1-B)

in Formula (M1-A), A1 is a divalent group selected from the group consisting of an aromatic hydrocarbon group, a heterocyclic group, and an alicyclic group, a1 represents an integer of 1 to 10, * represents a bonding position to SP1 or T1, and in Formula (M1-B), A2 and A3 each independently represent a divalent group selected from the group consisting of an aromatic hydrocarbon group, a heterocyclic group, and an alicyclic group, LA1 represents a single bond or a divalent linking group, a2 represents an integer of 1 to 10, * represents a bonding position to SP1 or T1, in a case where a2 is 1, LA1 is a divalent linking group, in a case where a2 is 2 or greater, a plurality of LA1's each independently represent a single bond or a divalent linking group, and at least one of the plurality of LA1's is a divalent linking group,

 (4)

in Formula (4), $n_A$ represents an integer of 3 or greater, a plurality of PI's represent a polymer chain containing of the repeating unit represented by Formula (1), A represents an atomic group which is a core of the star polymer.

2. The liquid crystalline composition according to claim 1, wherein the polymer liquid crystal compound further contains a repeating unit represented by Formula (2), and in Formula (2), a difference between a log P value of P2, L2, and SP2 and a log P value of M2 is less than 4,

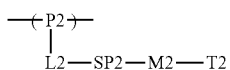 (2)

in Formula (2), P2 represents a main chain of the repeating unit, L2 represents a single bond or a divalent linking group, SP2 represents a spacer group, M2 represents a mesogenic group, and T2 represents a terminal group.

3. The liquid crystalline composition according to claim 1, wherein the polymer liquid crystal compound further contains a repeating unit represented by Formula (3),

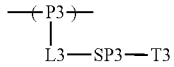 (3)

in Formula (3), P3 represents a main chain of the repeating unit, L3 represents a single bond or a divalent linking group, SP3 represents a spacer group, and T3 represents a terminal group.

4. The liquid crystalline composition according to claim 1, wherein the polymer liquid crystal compound contains two or more kinds of repeating units represented by Formula (1).

5. The liquid crystalline composition according to claim 1, wherein a weight-average molecular weight of the polymer liquid crystal compound is 10,000 or greater.

6. The liquid crystalline composition according to claim 1, wherein a weight-average molecular weight of the polymer liquid crystal compound is less than 10,000.

7. A polymer liquid crystal compound comprising:
a repeating unit represented by Formula (1),
wherein in Formula (1), a difference between a log P value of P1, L1, and SP1 and a log P value of M1 is 4.25 or greater,
wherein a weight-average molecular weight of the polymer liquid crystal compound is 10,000 or greater, and
wherein the polymer liquid crystal compound is a star polymer represented by Formula (4),

 (1)

in Formula (1), P1 represents a main chain of the repeating unit represented by Formula (P1-A), L1 is —C(O)O—, SP1 is a group represented by *—(CH$_2$—CH$_2$O)$_{n1}$—*, in the formula, n1 represents an integer of 1 to 20, and * represents a bonding position to L1 or M1, M1 is a group represented by Formula (M1-B), and T1 is an alkoxy group having 1 to 10 carbon atoms,

 (P1-A)

$R^1$ represents a hydrogen atom or a methyl group, and

 (M1-B)

in Formula (M1-B), A2 and A3 each independently represent a divalent group selected from the group consisting of an aromatic hydrocarbon group, a heterocyclic group, and an alicyclic group, LA1 represents a single bond or a divalent linking group, a2 represents an integer of 1 to 10, * represents a bonding position to SP1 or T1, in a case where a2 is 1, LA1 is a divalent linking group, in a case where a2 is 2 or greater, a plurality of LA1's each independently represent a single bond or a divalent linking group, and at least one of the plurality of LA1's is a divalent linking group,

 (4)

in Formula (4), $n_4$ represents an integer of 3 or greater, a plurality of Pl's represent a polymer chain containing of the repeating unit represented by Formula (1), A represents an atomic group which is a core of the star polymer.

8. The polymer liquid crystal compound according to claim 7, further comprising:

a repeating unit represented by Formula (2), wherein in Formula (2), a difference between a log P value of P2, L2, and SP2 and a log P value of M2 is less than 4,

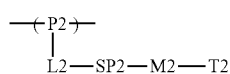
(2)

in Formula (2), P2 represents a main chain of the repeating unit, L2 represents a single bond or a divalent linking group, SP2 represents a spacer group, M2 represents a mesogenic group, and T2 represents a terminal group.

9. The polymer liquid crystal compound according to claim 7, further comprising:

a repeating unit represented by Formula (3),

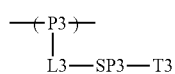
(3)

in Formula (3), P3 represents a main chain of the repeating unit, L3 represents a single bond or a divalent linking group, SP3 represents a spacer group, and T3 represents a terminal group.

10. The polymer liquid crystal compound according to claim 7, comprising:

two or more kinds of repeating units represented by Formula (1).

11. A light absorption anisotropic film comprising a liquid crystalline composition, the liquid crystalline composition comprising:

a polymer liquid crystal compound which contains a repeating unit represented by Formula (1); and a dichroic substance, wherein the dichroic substance is a visible light absorbing substance, and wherein in Formula (1), a difference between a log P value of P1, L1, and SP1 and a log P value of M1 is 4 or greater,

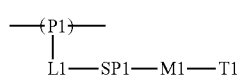
(1)

in Formula (1), P1 represents a main chain of the repeating unit represented by Formula (P1-A), L1 includes at least one selected from the group consisting of —C(O)O—, —OC(O)—, —O—, —S—, —C(O)NR³—, —NR³C(O)—, —S(O)₂—, and —NR³R⁴—, in the formula, R³ and R⁴ each independently represent a hydrogen atom or an alkyl group having 1 to 6 carbon atoms which may have a substituent, SP1 includes at least one selected from the group consisting of an oxyethylene structure, an oxypropylene structure, a polysiloxane structure, and a fluorinated alkylene structure, M1 is a group represented by Formula (M1-A) or (M1-B), and T1 represents a terminal group,

(P1-A)

$R^1$ represents a hydrogen atom or a methyl group,

(M1-A)
(M1-B)

in Formula (M1-A), A1 is a divalent group selected from the group consisting of an aromatic hydrocarbon group, a heterocyclic group, and an alicyclic group, a1 represents an integer of 1 to 10, * represents a bonding position to SP1 or T1, in Formula (M1-B), A2 and A3 each independently represent a divalent group selected from the group consisting of an aromatic hydrocarbon group, a heterocyclic group, and an alicyclic group, LA1 represents a single bond or a divalent linking group, a2 represents an integer of 1 to 10, * represents a bonding position to SP1 or T1, in a case where a2 is 1, LA1 is a divalent linking group, in a case where a2 is 2 or greater, a plurality of LA1's each independently represent a single bond or a divalent linking group, and at least one of the plurality of LA1's is a divalent linking group.

12. A laminate comprising:

a base; and the light absorption anisotropic film according to claim 11 which is provided on the base.

13. The laminate according to claim 12, further comprising:

a λ/4 plate which is provided on the light absorption anisotropic film.

14. An image display device comprising:

the light absorption anisotropic film according to claim 11.

15. A laminate comprising:

a base; and a light absorption anisotropic film including a liquid crystalline composition; and a photo-alignment film disposed between the base and the light absorption anisotropic film, the liquid crystalline composition comprising:

a polymer liquid crystal compound which contains a repeating unit represented by Formula (1); and a dichroic substance, wherein the dichroic substance is a visible light absorbing substance, and wherein in Formula (1), a difference between a log P value of P1, L1, and SP1 and a log P value of M1 is 4 or greater,

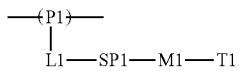 (1)

in Formula (1), P1 represents a main chain of the repeating unit represented by Formula (P1-A), L1 includes at least one selected from the group consisting of —C(O)O—, —OC(O)—, —O—, —S—, —C(O)NR$^3$—, —NR$^3$C(O)—, —S(O)$_2$—, and —NR$^3$R$^4$—, in the formula, R$^3$ and R$^4$ each independently represent a hydrogen atom or an alkyl group having 1 to 6 carbon atoms which may have a substituent, SP1 includes at least one selected from the group consisting of an oxyethylene structure, an oxypropylene structure, a polysiloxane structure, and a fluorinated alkylene structure, M1 is a group represented by Formula (M1-A) or (M1-B), and T1 represents a terminal group,

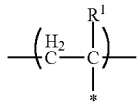 (P1-A)

R$^1$ represents a hydrogen atom or a methyl group,

 (M1-A)

 (M1-B)

in Formula (M1-A), A1 is a divalent group selected from the group consisting of an aromatic hydrocarbon group, a heterocyclic group, and an alicyclic group, a1 represents an integer of 1 to 10, * represents a bonding position to SP1 or T1, in Formula (M1-B), A2 and A3 each independently represent a divalent group selected from the group consisting of an aromatic hydrocarbon group, a heterocyclic group, and an alicyclic group, LA1 represents a single bond or a divalent linking group, a2 represents an integer of 1 to 10, * represents a bonding position to SP1 or T1, in a case where a2 is 1, LA1 is a divalent linking group, in a case where a2 is 2 or greater, a plurality of LA1's each independently represent a single bond or a divalent linking group, and at least one of the plurality of LA1's is a divalent linking group.

* * * * *